(12) United States Patent
Zhao et al.

(10) Patent No.: US 11,745,440 B2
(45) Date of Patent: Sep. 5, 2023

(54) AUTOMATED LAMINATION SYSTEM AND METHOD FOR EMBEDDING PRINTED ELECTRONIC ELEMENTS IN A COMPOSITE STRUCTURE

(71) Applicant: The Boeing Company, Chicago, IL (US)

(72) Inventors: Da Zhao, Everett, WA (US); Keith Daniel Humfeld, Federal Way, WA (US)

(73) Assignee: The Boeing Company, Arlington, VA (US)

(*) Notice: Subject to any disclaimer, the term of this patent is extended or adjusted under 35 U.S.C. 154(b) by 347 days.

(21) Appl. No.: 16/840,315

(22) Filed: Apr. 3, 2020

(65) Prior Publication Data
US 2021/0308961 A1    Oct. 7, 2021

(51) Int. Cl.
*B29C 70/38* (2006.01)
*B29C 33/02* (2006.01)
*B29C 33/38* (2006.01)

(52) U.S. Cl.
CPC .............. *B29C 70/38* (2013.01); *B29C 33/02* (2013.01); *B29C 33/38* (2013.01)

(58) Field of Classification Search
CPC ........ B29C 65/02; B29C 33/02; H05K 3/1241
USPC ........................................................ 156/60
See application file for complete search history.

(56) References Cited

U.S. PATENT DOCUMENTS

| 7,842,145 B2 | 11/2010 | Hogg |
| 8,766,511 B2 | 7/2014 | Duce et al. |
| 9,801,276 B2 | 10/2017 | Johnston et al. |
| 2009/0061213 A1* | 3/2009 | Bahnmuller ......... H05K 3/1258 428/332 |
| 2015/0034247 A1* | 2/2015 | Silcock ............... B29C 66/9241 156/437 |

(Continued)

OTHER PUBLICATIONS

"TapeCustomConverting," T2C Applycut—Automatic adhesive tape application, <https://www.youtube.com/watch?v=luQgXrjBpRc> Available Sep. 29, 2018 (Year: 2018).*

(Continued)

*Primary Examiner* — Hana C Page

(57) ABSTRACT

There is provided an automated lamination system for embedding printed electronic element(s) in a composite structure. The automated lamination system includes a supply of composite prepreg material, a layup tool assembly, and a modified automated lamination apparatus laying up layer(s) of the composite prepreg material on the layup tool assembly, to form the composite structure. The modified automated lamination apparatus includes a section preparation pre-printing apparatus preparing section(s) on a top surface of a top layer of the layer(s), to obtain prepared section(s), and includes a non-contact direct write printing apparatus mechanically coupled to the section preparation pre-printing apparatus, and includes one or more supplies of electronic element materials, printed with the non-contact direct write printing apparatus, on each of the prepared section(s), to obtain the printed electronic element(s), that are embedded in the composite structure. The automated lamination system further includes a control system and a power system.

20 Claims, 14 Drawing Sheets

(56) References Cited

U.S. PATENT DOCUMENTS

| | | | |
|---|---|---|---|
| 2015/0342077 A1* | 11/2015 | Dalal | C23C 4/08 |
| | | | 264/447 |
| 2017/0006701 A1* | 1/2017 | Casasanta, III | B32B 27/285 |
| 2017/0232641 A1 | 8/2017 | Humfeld et al. | |
| 2017/0232643 A1 | 8/2017 | Humfeld et al. | |
| 2019/0386474 A1* | 12/2019 | Rodeghiero | B64D 47/00 |
| 2022/0016842 A1* | 1/2022 | Leyva Mendivil | G01K 3/14 |

OTHER PUBLICATIONS

Calawa, Rick, et al., "Medium Wave Infrared Heater for High-Speed Fiber Placement", 07ATC-251, SAE International, 2007, 5 pages.

Lee, Gil-Yong, et al., "Direct Printing of Strain Sensors Via Nanoparticle Printer for the Applications to Composite Structural Health Monitoring", Elsevier B.V., Procedia CIRP 66, 2017, pp. 238-242.

Zhao, Da, et al., "Fabrication and Characterization of Aerosol-jet Printed Strain Sensors for Multifunctional Composite Structures", IOP Publishing Ltd, Smart Materials and Structures 21, 2012, 115008, 9 pages.

\* cited by examiner

```
AUTOMATED LAMINATION SYSTEM 10

COMPOSITE STRUCTURE 12   COMPOSITE LAMINATE 14        AIRCRAFT COMPOSITE PART 16
  INTERIOR 28   INTERIOR PORTION(S) 30   MANUFACTURE 36        OPERATIONAL LIFE 38
  SUPPLY 39  COMPOSITE PREPREG MATERIAL 40   FIBER(S) 42  RESIN 44  TAPE 46   SHEET(S) 48
  FABRIC 50   TOWS 52   LAYER(S) 58   TOP LAYER 58a   TOP SURFACE 59   SUBSEQUENT LAYER(S) 58b
  SECTION(S) 94       SIZE 102      WIDTH 104     LENGTH 106        THICKNESS 108

LAYUP TOOL ASSY. 54   LAYUP TOOL 55   SURFACE 56   PLANAR SURF. 56a   CONTOURED SURF. 56b

MODIFIED AUTOMATED LAMINATION APPARATUS 60      CTLM 66        CNC CTLM 68
  MOD. AUTOMATED TAPE LAYING APP. 70           MOD. AUTOMATED FIBER PLACEMENT APP. 80
  AUTOMATED PLACEMENT PROC. 62   ATL PROCESS 72   AFP PROCESS 82   ROBOT 90   GANTRY 91
  FIRST HEAD 74   PLACEMENT HEAD 74a   SPOOL(S) 84   HEATER 86   COMPACTION ROLLER(S) 88

SECTION PREPARATION PRE-PRINTING APPARATUS 92
  ENER. SOURCE APP. 114  RADIAT. HEATER 116  IR HEATER 118  LASER APP. 120   LASER GUN 120a
  STAGED RESIN PROCESS 122   LOCALIZED PARTIAL CURE OPERATION 124   DEGREE OF CURE 126
  PREPARED SECT.(S) 96   LOCALIZED PARTIALLY CURED SECT.(S) 96a   STAMPED SUBST SECT.(S) 96b
  STAMPING APPARATUS 130    SUBSTRATE STAMP PROCESS 132    SUBSTRATE MATERIAL 134

NON-CONTACT DIRECT WRITE PRINTING APPARATUS 110      SECOND HEAD 112
  AEROSOL JET PRINTING APP. 138   PRINTING HEAD(S) 140   CONTAINER(S) 142   SUPPLY(IES) 97
  ELECTR. ELEM. MAT.(S) 98   PARTICLE SIZE 146   VISCOSITY 148   INK 144   NANOPARTICLE INK 144a

PRINTED ELECTRONIC ELEMENT(S) 100    CONDUCTIVE PATH 136       FINAL CURE PROCESS 128
  SENSORS 100a   STRAIN SENSORS 100b   PRESSURE SENSORS 100c   TEMPERATURE SENSORS 100d
  STRAIN GAUGES 100e   TRACES 100f   RESISTORS 100g   CONDUCTORS 100h   INSULATORS 100i
  INDUCTORS 100j   CAPACITORS 100k    TRANSISTORS 100l       SOLAR CELLS 100m
  MICRO-BATTERIES 100n   CIRC. ELEMTS. 100o   INTERCONNECT ELEMTS. 100p   TRANSDUCERS 100q
  ANTENNAS 100r   MICRO-ANTENNAS 100s   ANTENNA ELEM. 100t   ANTENNA ARRAYS 100u   RFID 100v

CONTROL SYSTEM 78   OPERATION(S) 152       CONTROLLER 154        COMPUTER(S) 76
  POWER SYSTEM 156   POWER SOURCE 158   WIRED CONNECT.(S) 160   WIRELESS CONNECTION 162
```

FIG. 1B

AUTOMATED LAMINATION SYSTEM AND METHOD FOR EMBEDDING PRINTED ELECTRONIC ELEMENTS IN A COMPOSITE STRUCTURE

FIELD

The disclosure relates generally to methods and systems of forming composite structures, and more particularly, to methods and systems of forming composite structures with printed electronic elements, such as sensors, that are embedded in the composite structures.

BACKGROUND

Electronics, such as sensors, for example, strain sensors, pressure sensors, temperature sensors, or other types of sensors, are commonly used for testing, monitoring, and collecting operational and structural health data of composite structures, such as composite parts for aircraft, rotorcraft, spacecraft, watercraft, and other vehicles, during the manufacture of such composite structures and during the operational life of such vehicles. Measurements of strain, pressure, temperature, or other measurements, taken with such sensors, may be used to monitor and evaluate the operational and structural health of a composite structure, and may be used to detect possible structural issues with the composite structure.

Known systems and methods exist for installing sensors in composite structures. One known system and method involves manual installation of sensors, such as strain sensors or thermocouples (i.e., temperature sensors), on the surface of a composite structure or part. However, the manual installation of such sensors may be labor intensive, time consuming, and costly, and it may be difficult to test or monitor locations where such sensors cannot be added on the composite structure or part. Moreover, the manual installation of thermocouples may be limited to placement at the edge of a composite structure or part, so that possible mark-off caused by the thermocouple can be removed when the composite structure or part is trimmed. Further, it may be difficult to install such sensors on contoured or curved surfaces of composite structures or parts after they are fabricated, and may result in issues with alignment and placement accuracy, repeatability, and quality. Further, the manual installation of such sensors in the interior of the composite structure may not be repeatable and may result in complications with the adhesion process in the composite structure or part.

In addition, other known systems and methods exists that involve manually printing, such as with ink jet printing or aerosol jet printing, sensors, such as strain sensors, on the surface of a cured composite structure, after it has been cured. However, such manual printing on a cured composite structure, such as a cured laminate, may cause issues with co-curing with other laminates. Moreover, due to aerodynamics and durability reasons, such sensors cannot be manually printed on an exterior aero surface of the composite structure or part.

In addition, other known systems and methods exists that involve manually printing, such as with ink jet printing or aerosol jet printing, sensors, such as strain sensors, on the surface, or in the interior, of an uncured composite structure or part, prior to it being cured. However, such manual printing prior to curing may result in disruption of the conductive paths of the printed sensors caused by the flow of resin during the curing process of the composite structure or part.

Accordingly, there is a need in the art for an automated lamination system and method for embedding one or more printed electronic elements, such as sensors, in composite structures, that enable printing of electronic elements, such as sensors, throughout the interior and thickness of the composite structures, and that are repeatable, low cost, and automated, and that provide advantages over known systems and methods.

SUMMARY

Example implementations of the present disclosure provide an automated lamination system and automated lamination methods for embedding one or more printed electronic elements in composite structures. As discussed in the below detailed description, versions of the automated lamination system and the automate lamination methods for embedding one or more printed electronic elements in composite structures may provide significant advantages over known systems and methods.

In a version of the disclosure, there is provided an automated lamination system for embedding one or more printed electronic elements in a composite structure. The automated lamination system comprises a supply of composite prepreg material, a layup tool assembly, and a modified automated lamination apparatus laying up one or more layers of the composite prepreg material on the layup tool assembly, to form the composite structure.

The modified automated lamination apparatus comprises a section preparation pre-printing apparatus preparing one or more sections on a top surface of a top layer of the one or more layers, to obtain one or more prepared sections. The modified automated lamination apparatus further comprises a non-contact direct write printing apparatus mechanically coupled to the section preparation pre-printing apparatus. The modified automated lamination apparatus further comprises one or more supplies of electronic element materials, printed with the non-contact direct write printing apparatus, on each of the one or more prepared sections, to obtain the one or more printed electronic elements.

The modified automated lamination apparatus lays up one or more subsequent layers of the composite prepreg material over the one or more printed electronic elements, to embed the one or more printed electronic elements in the composite structure, prior to the composite structure being cured with a final cure process. When the composite structure is cured, the one or more printed electronic elements each maintain a mechanical stability.

The automated lamination system further comprises a control system coupled to the modified automated lamination apparatus. The control system controls one or more operations of the modified automated lamination apparatus. The automated lamination system further comprises a power system coupled to the modified automated lamination apparatus. The power system provides a power source to the modified automated lamination apparatus.

In another version of the disclosure, there is provided an automated lamination method for embedding one or more printed electronic elements in a composite structure. The automated lamination method comprises the step of using a modified automated lamination apparatus to form the composite structure, by laying up one or more layers of a composite prepreg material on a layup tool assembly. The modified automated lamination apparatus comprises a section preparation pre-printing apparatus mechanically coupled to a non-contact direct write printing apparatus.

The automated lamination method further comprises the step of preparing, with the section preparation pre-printing apparatus, one or more sections on a top surface of a top layer of the one or more layers, to obtain one or more prepared sections. The automated lamination method further comprises the step of printing, with the non-contact direct write printing apparatus, one or more electronic element materials on each of the one or more prepared sections, to obtain one or more printed electronic elements.

The automated lamination method further comprises the step of using the modified automated lamination apparatus to lay up one or more subsequent layers of composite prepreg material over the one or more printed electronic elements, to embed the one or more printed electronic elements in the composite structure. The automated lamination method further comprises the step of curing the composite structure having the one or more printed electronic elements embedded in the composite structure, wherein the one or more printed electronic elements each maintain a mechanical stability during and after curing.

In another version of the disclosure, there is provided an automated lamination method for embedding one or more printed electronic elements in an aircraft composite part. The automated lamination method comprises the step of using a modified automated lamination apparatus to form the aircraft composite part, by laying up one or more layers of a composite prepreg material on a layup tool assembly. The modified automated lamination apparatus comprises a section preparation pre-printing apparatus mechanically coupled to an aerosol jet printing apparatus.

The automated lamination method further comprises the step of preparing, with the section preparation pre-printing apparatus, one or more sections on a top surface of a top layer of the one or more layers, to obtain one or more prepared sections. The automated lamination method further comprises the step of printing, with the aerosol jet printing apparatus, one or more electronic element materials on each of the one or more prepared sections, to obtain one or more printed electronic elements.

The automated lamination method further comprises the step of using the modified automated lamination apparatus to lay up one or more subsequent layers of composite prepreg material over the one or more printed electronic elements, to embed the one or more printed electronic elements in the aircraft composite part. The automated lamination method further comprises the step of repeating one or more times, all of the steps of preparing with the section preparation pre-printing apparatus, printing with the aerosol jet printing apparatus, and using the modified automated lamination apparatus to lay up the one or more subsequent layers.

The automated lamination method further comprises the step of curing the aircraft composite part having the one or more printed electronic elements embedded in the aircraft composite part, wherein the one or more printed electronic elements each maintain a mechanical stability during and after curing. The automated lamination method further comprises the step of using the one or more printed electronic elements embedded in the aircraft composite part, to enable data collection and structural health monitoring in one or more interior portions of the aircraft composite part.

The features, functions, and advantages that have been discussed can be achieved independently in various embodiments of the disclosure or may be combined in yet other embodiments further details of which can be seen with reference to the following description and drawings.

BRIEF DESCRIPTION OF THE DRAWINGS

The disclosure can be better understood with reference to the following detailed description taken in conjunction with the accompanying drawings which illustrate preferred and exemplary versions, but which are not necessarily drawn to scale, wherein:

FIG. 1B is an illustration of a functional block diagram showing the exemplary version of the automated lamination system of FIG. 1A in further detail;

The Figures shown in this disclosure represent various aspects of the versions presented, and only differences will be discussed in detail.

DETAILED DESCRIPTION

Disclosed versions or embodiments will now be described more fully hereinafter with reference to the accompanying drawings, in which some, but not all of the disclosed versions are shown. Indeed, several different versions may be provided and should not be construed as limited to the versions set forth herein. Rather, these versions are provided so that this disclosure will be thorough and fully convey the scope of the disclosure to those skilled in the art.

This specification includes references to "one version" or "a version". The instances of the phrases "in one version" or "in a version" do not necessarily refer to the same version. Particular features, structures, or characteristics may be combined in any suitable manner consistent with this disclosure.

As used herein, "comprising" is an open-ended term, and as used in the claims, this term does not foreclose additional structure or steps.

As used herein, "configured to" means various parts or components may be described or claimed as "configured to" perform a task or tasks. In such contexts, "configured to" is used to connote structure by indicating that the parts or components include structure that performs those task or tasks during operation. As such, the parts or components can be said to be configured to perform the task even when the specified part or component is not currently operational (e.g., is not on).

As used herein, the terms "first", "second", etc., are used as labels for nouns that they precede, and do not imply any type of ordering (e.g., spatial, temporal, logical, etc.).

Figure 1A:
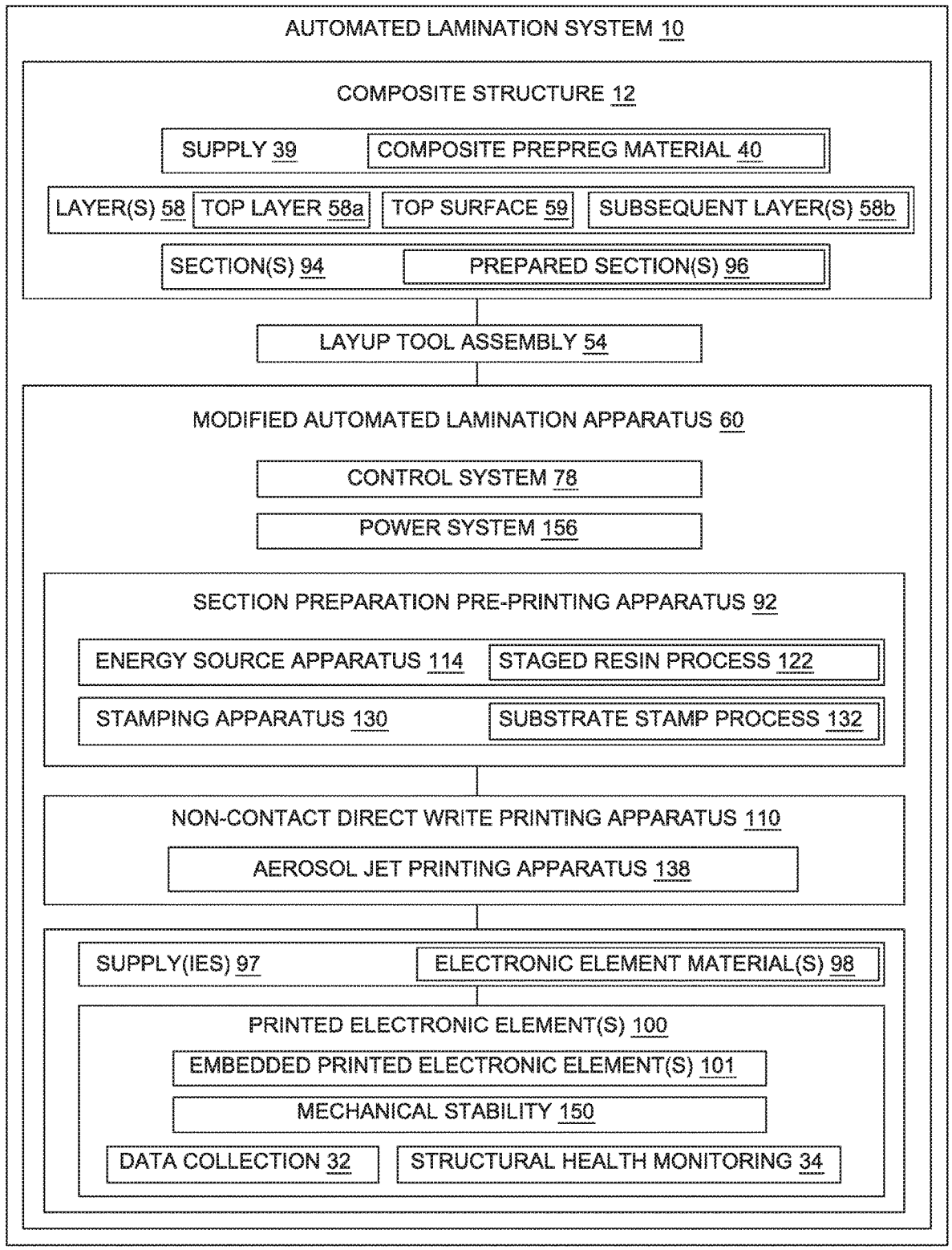
FIG. 1A is an illustration of a functional block diagram showing an exemplary version of an automated lamination system of the disclosure.

Now referring to the Figures, FIG. 1A is an illustration of a functional block diagram showing an exemplary version of an automated lamination system 10 of the disclosure, and FIG. 1B is an illustration of a functional block diagram showing the exemplary version of the automated lamination system 10 of FIG. 1A in further detail.

FIGS. 1A-1B are illustrations of functional block diagrams showing an exemplary version of the automated lamination system 10 of the disclosure. The blocks in FIGS. 1A-1B represent elements, and lines connecting the various blocks do not imply any particular dependency of the elements. Furthermore, the connecting lines shown in the various Figures contained herein are intended to represent example functional relationships and/or physical couplings between the various elements, but it is noted that other alternative or additional functional relationships or physical connections may be present in versions disclosed herein.

In a version of the disclosure, as shown in FIGS. 1A-1B, there is provided the automated lamination system 10 for embedding one or more printed electronic elements 100 in a composite structure 12. The composite structure 12 may comprise a composite laminate 14 (see FIG. 1B), an aircraft composite part 16 (see FIG. 1B) for assembly into an aircraft 18 (see FIG. 1B), or another suitable composite structure. The aircraft composite part 16 may comprise panels 20 (see FIG. 9) for wings 22 (see FIG. 9), fuselage 24 (see FIG. 9), a tail 26 (see FIG. 9), or other parts that may be assembled for an aircraft 18 (see FIG. 9) and incorporated in the aircraft 18.

The one or more printed electronic elements 100 are preferably embedded printed electronic elements 101 (see FIG. 1A) that are embedded in an interior 28 (see FIG. 1B) of the composite structure 12 at one or more interior portions 30 (see FIG. 1B) of the interior 28 of the composite structure 12, such as the aircraft composite part 16. The one or more printed electronic elements 100 are printed between layers 58 (see FIGS. 1A-1B) of composite prepreg material 40 (see FIGS. 1A-1B) prior to cure, such as a final cure process 128 (see FIG. 1B), rather than on the surface of a cured composite structure or part.

The one or more printed electronic elements 100 enable data collection 32 (see FIG. 1A) and structural health monitoring 34 (see FIG. 1A) throughout the interior 28 of the composite structure 12, such as the aircraft composite part 16, for example, during manufacture 36 (see FIG. 1B) of the composite structure 12, such as the aircraft composite part 16, and/or during an operational life 38 (see FIG. 1B) of the aircraft 18 (see FIG. 9), or other vehicle, that the composite structure 12, such as the aircraft composite part 16, is incorporated into. The printed electronic elements 100 are discussed in further detail below.

As shown in FIGS. 1A-1B, the automated lamination system 10 comprises a supply 39 of composite prepreg material 40 used in forming the composite structure 12. The composite prepreg material 40 preferably comprises fibers 42 (see FIG. 1B), such as reinforcement fibers, for example, carbon fibers, polymer fibers, glass fibers, fiberglass, or other suitable fibers, that are pre-impregnated with a resin 44 (see FIG. 1B), such as a thermoplastic resin or a thermoset resin. Examples of thermoplastic resins comprise thermoplastic polymer resin materials such as, polyether ether ketone (PEEK), polyetherketoneketone (PEKK), polyethylene terephthalate (PET), polyethylene (PE), polyphenylene sulfide (PPS), polypropylene (PP), polyamide (PA), polyetherimide (PEI), polyester, or other suitable thermoplastic polymer resin materials. Examples of thermoset resins comprise thermoset polymer resin materials such as, epoxy, bismaleimide (BMI), phenolics, or other suitable thermoset polymer resin materials. As shown in FIG. 1B, the composite prepreg material 40 may be in the form of tape 46, such as unidirectional tape, sheets 48, fabric 50, such as woven or unwoven fabric, tows 52, such as fiber tows, or another suitable form. The fibers 42 (see FIG. 1B) of the composite prepreg material 40 typically each have a diameter in a range of 5 microns (μ) to 7 microns (μ), and a thickness of an interply region may be 20 microns (μ). The interply region has no fibers 42, and only has resin 44 (see FIG. 1B) and/or toughener elements.

As shown in FIGS. 1A-1B, the automated lamination system 10 further comprises a layup tool assembly 54. As shown in FIG. 1B, the layup tool assembly 54 comprises a layup tool 55, for example, a mold or a mandrel, having a surface 56 for laying up the composite prepreg material 40. The surface 56 of the layup tool 55 may be in the form of a planar surface 56a (see FIG. 1B), such as a flat surface, or may comprise a contoured surface 56b (see FIG. 1B), such as three-dimensional curved surface. The composite prepreg material 40 is placed, or laid up, on the surface 56 of the layup tool 55 in a sequence, or stack, of one or more layers 58 (see FIGS. 1A-1B), or plies. The layers 58 of composite prepreg material 40, such as tape 46 or tows 52, may be laid up on the layup tool 55 as a symmetric cross-ply laminate.

As shown in FIGS. 1A-1B, the automated lamination system 10 further comprises a modified automated lamination apparatus 60. The placement of the composite prepreg material 40 on the layup tool 55 is performed with an automated placement process 62 (see FIG. 1B) carried out using the modified automated lamination apparatus 60. The modified automated lamination apparatus 60 comprises an automated lamination apparatus 64 (see FIG. 1B) that has been modified, as discussed below. The automated lamination apparatus 64 preferably comprises a composite tape laying machine (CTLM) 66 (see FIG. 1B), for example, a computer numerically controlled (CNC) CTLM 68 (see FIG. 1B), that has been modified. The modified automated lamination apparatus 60 is configured to lay up, and lays up, one or more layers 58, or plies, of the composite prepreg material

40 on the surface 56 of the layup tool 55 of the layup tool assembly 54, to form the composite structure 12, such as the composite laminate 14, for example, the aircraft composite part 16.

In one version, the modified automated lamination apparatus 60, such as in the form of the CTLM 66 or CNC CTLM 68 that has been modified, comprises a modified automated tape laying (ATL) apparatus 70 (see FIG. 1B), that uses an automated tape laying (ATL) process 72 (see FIG. 1B) to automatically lay up tape 46 on the layup tool 55, via a first head 74 (see FIG. 1B), such as a placement head 74*a* (see FIG. 1B), that is computer and/or robotically controlled. The modified automated tape laying apparatus 70 is capable of high rate, continuous, lay up of composite prepreg material 40, such as tape 46, over layup tools 55, for example, molds or mandrels, that are large, and planar or contoured, and typically accommodate single continuous sheets 48 of tape 46 having broad widths of 6 inches, 12 inches, 24 inches, or another suitable tape width. The length of the tape 46 is regulated automatically depending on how the ATL process 72 is programmed into a computer 76 (see FIG. 1B) of a control system 78 (see FIGS. 1A-1B) used to control the modified automated lamination apparatus 60, such as in the form of the modified automated tape laying apparatus 70. The tape 46 is placed on the layup tool 55 in layers 58, or plies, at lengths and angles defined and controlled by machine-control software used with the computer 76 of the control system 78 and that is programmed with numerical input derived from the design of the composite structure 12 to be formed.

In another version, the modified automated lamination apparatus 60, such as in the form of the CTLM 66 or CNC CTLM 68, that has been modified, comprises a modified automated fiber placement (AFP) apparatus 80 (see FIG. 1B), that uses an automated fiber placement (AFP) process 82 (see FIG. 1B) to automatically lay up multiple courses of individual pieces of composite prepreg material 40, in the form of thin tape or a bundle of fibers 42, such as carbon fibers, referred to as tows 52, on the layup tool 55 using the placement head 74*a* (see FIG. 1B), that is computer or robotically controlled. The modified automated fiber placement apparatus 80 is capable of stacked, overlapping, and/or side-by-side layup of the tows 52 over the layup tools 55, for example, molds or mandrels, that are large, and contoured or planar, and the modified automated fiber placement apparatus 80 accommodates multiple courses of tows 52 having narrow widths of 0.5 inch, 1 inch, 1.5 inches, or another suitable tow width. The courses of tows 52 may be placed in orientations of 0°, +45°, −45° and 90° to build up the layers 58, or plies, on the layup tool 55. The length of the tows 52 are regulated automatically depending on how the AFP process 82 is programmed into the computer 76 (see FIG. 1B) of the control system 78 (see FIGS. 1A-1B) used to control the modified automated lamination apparatus 60, such as the modified automated fiber placement apparatus 80. The tows 52 are placed on the layup tool 55 to form the layers 58 at lengths and angles defined and controlled by machine-control software used with the computer 76 of the control system 78 and that is programmed with numerical input derived from the design of the composite structure 12 to be formed. The modified automated fiber placement apparatus 80 and the AFP process 82 may be advantageous for forming composite structures 12 with complex layup geometries and contoured surfaces.

The automated lamination system 10 may be used with the modification of the CTLM 66 that lays up multiple courses of thin tape, or tows 52, such as the modified automated fiber placement (AFP) apparatus 80. Alternatively, the automated lamination system 10 may be used with the modification of the CTLM 66 that lays up broad sections of tape 46, such as the modified automated tape laying (ATL) apparatus 70.

As shown in FIG. 1B, the modified automated lamination apparatus 60, such as in the form of the CTLM 66 or CNC CTLM 68, that has been modified, for example, the modified automated tape laying apparatus 70 or the modified automated fiber placement apparatus 80, may comprise the first head 74, such as the placement head 74*a*, one or more spool(s) 84 for spooling and feeding the composite prepreg material 40, such as in the form of tape 46 or tows 52, a heater 86 for heating and curing, with a final cure process 128, the composite structure 12 after it is formed on the layup tool 55, and one or more compaction rollers 88 for placing, consolidating, and/or compacting the layers 58 of the composite prepreg material 40 on the layup tool 55. The first head 74, such as the placement head 74*a*, may be coupled to the end of a robot 90 (see FIG. 1B), such as a multi-axis articulating robot, that moves around the layup tool 55, for example, the mold or mandrel, to which the composite prepreg material 40 is being applied. In addition to the coupling to the robot 90, or instead of the coupling to the robot 90, the first head 74, such as the placement head 74*a*, may be located on, or coupled to, a gantry 91 (see FIG. 1B) suspended above the layup tool 55.

The modified automated lamination apparatus 60, such as in the form of the CTLM 66 or CNC CTLM 68, that has been modified, for example, the modified automated tape laying apparatus 70 or the modified automated fiber placement apparatus 80, may further comprise other components known in the art, such as one or more guides to guide the composite prepreg material 40, one or more winding rollers to wind and dispense the composite prepreg material 40, a cutter or slitter to cut or slit the composite prepreg material 40, one or more sensors for positioning the placement of the composite prepreg material 40 on the layup tool 55, and/or other suitable components.

As shown in FIGS. 1A-1B, the modified automated lamination apparatus 60 comprises a section preparation pre-printing apparatus 92, configured to prepare, and preparing, one or more sections 94, or portions, on a top surface 59 of a top layer 58*a* of the one or more layers 58, that have been laid up on the layup tool 55, to obtain one or more prepared sections 96, or prepared portions, prior to printing one or more electronic element materials 98, to form one or more printed electronic elements 100. Each of the one or more sections 94 has a size 102 (see FIG. 1B) preferably having a width 104 (see FIG. 1B) in a range of 10 microns (µ) to 20 microns (µ), preferably having a length 106 (see FIG. 1B) in a range of 10 microns (µ) to 10 meters (m), such as in one example, a length 106 in a range of 10 microns (µ) to 20 microns (µ), and in another example, a length 106 in a range of 0.01 meter (10 centimeters) to 10 meters (1000 centimeters), and preferably having a thickness 108 (see FIG. 1B) in a range of 0.01 micron (µ) (10 nanometers (nm)) to 0.1 micron (µ) (100 nanometers (nm)). Where each of the one or more sections 94 has a length 106 in a range of 0.01 meter to 10 meters, this length 106 may be for a section 94 for a continuous conductive path to a location on the composite structure 12, such as the aircraft composite part 16, designated for interface with an external electronic system.

The modified automated lamination apparatus 60 is modified by adding the section preparation pre-printing apparatus 92, and adding a non-contact direct write printing apparatus 110 (see FIGS. 1A-1B), discussed below, that is mechanically coupled, or attached, to the section preparation pre-printing apparatus 92. Together, the section preparation pre-printing apparatus 92 mechanically coupled, or attached, to the non-contact direct write printing apparatus 110, are preferably attached to, or positioned on, a second head 112 (see FIG. 1B) on the modified automated lamination apparatus 60. The second head 112 may be mechanically attached to the first head 74, such as the placement head 74a, of the modified automated lamination apparatus 60, or the second head 112 may be separate from, and not mechanically attached to, the first head 74, such as the placement head 74a. Alternatively, the section preparation pre-printing apparatus 92 mechanically coupled, or attached, to the non-contact direct write printing apparatus 110, may be attached to, or positioned at, a different location on, or in relation to, the modified automated lamination apparatus 60.

In one version, as shown in FIGS. 1A-1B, the section preparation pre-printing apparatus 92 comprises an energy source apparatus 114. As shown in FIG. 1B, the energy source apparatus 114 may comprise a radiative heater 116, for example, an infrared (IR) heater 118, such as a targeted IR heater, or another suitable radiative heater, or may comprise a laser apparatus 120, for example, a laser gun 120a, or another suitable laser apparatus, or may comprise another suitable energy source apparatus, for providing heat to partially cure, on a localized basis, the one or more sections 94 of the composite prepreg material 40. Preferably, the energy source apparatus 114 generates heat over each of the one or more sections 94, that are preferably 10 microns (µ) to 20 microns (µ) wide, on the layer 58, such as the top layer 58a, of the layers 58 of composite prepreg material 40.

The energy source apparatus 114 is configured to perform, and performs, a staged resin process 122 (see FIGS. 1A-1B) on each of the one or more sections 94, or portions, while the energy source apparatus 114 is coupled to, or on, the modified automated lamination apparatus 60, and during the formation of the composite structure 12. The staged resin process 122 comprises performing on each of the one or more sections 94, or portions, a localized partial cure operation 124 (see FIG. 1B), or "spot cure", to a degree of cure 126 (see FIG. 1B) in a range of 5% to 30%, and in one example, in a range of 5% to 10%, to obtain one or more prepared sections 96 (see FIGS. 1A-1B) comprising one or more localized partially cured sections 96a (see FIG. 1B). The percentage of the partial cure chosen in the range of 5% to 30%, and in one example, in the range of 5% to 10% depends on the resin 44 used in the composite prepreg material 40. The resin 44 is preferably staged on the top surface 59 of the top layer 58a, or ply, and not all the way through the top layer 58a, or through the thickness of the layers 58 under the top layer 58a, of the composite prepreg material 40 laid down on the layup tool 55. Further, the resin 44 is only staged on the one or more sections 94 on the layer(s) 58 of the composite prepreg material 40, where each of the one or more printed electronic elements 100 is/are to be printed and not all the way through the thickness of the top layer 58a, or through the thickness of the layers 58 under the top layer 58a, of the composite prepreg material 40, such as the tape 46, laid down on the layup tool 55.

The energy source apparatus 114, such as the radiative heater 116, partially cures, or spot cures, the one or more sections 94 on the layer 58, such as the top layer 58a, of the composite prepreg material 40, and stages the resin 44 to the degree of cure 126 in the range of 5% to 30%, and in one example, in the range of 5% to 10%, while still on the modified automated lamination apparatus 60, during the formation of the composite structure 12, to prevent disruption, by the flow of resin 44, of the one or more printed electronic elements 100 printed on the layer 58, such as the top layer 58a. The degree of cure 126 in the range of 5% to 30%, and in one example, in the range of 5% to 10%, of the one or more sections 94 of the composite prepreg material 40 confines the flow of resin 44 during the partial curing, or precuring, and the one or more partially cured sections serve as a good surface for printing of the printed electronic elements 100. The lower the flow of resin 44, the better the quality of the printing of the printed electronic elements 100 after a final cure process 128 (see FIG. 1B). The range of 5% to 30% degree of cure 126, and in one example, the range of 5% to 10% degree of cure 126, is a sufficient partial cure, or spot cure, that after cooling to room temperature, printing with the non-contact direct write print apparatus 110 (see FIGS. 1A-1B), such as the aerosol jet printing apparatus 138 (see FIGS. 1A-1B), and then heating again in the final cure process 128 (see FIG. 1B), the resin 44 (see FIG. 1B) never gets to a viscosity so low that the printed electronic elements 100, or electronics, are disrupted.

It does not take a significant amount of power to heat the small volume of the composite prepreg material 40, such as the section 94 having the width 104 in a range of 10 microns (µ) to 20 microns (µ). For example, the IR heater 118 that may be used in the staged resin process 122, to perform the localized partial cure operation 124, requires significantly less power than a heater 86 (see FIGS. 1B, 2) in the CTLM 66 or CNC CTLM 68, which is separate from the energy source apparatus 114 that is added to the modified automated lamination apparatus 60, and which is used for causing tack of the composite prepreg material 40 and/or used in the final cure process 128 (see FIG. 1B). The one or more sections 94 may be partially cured, or spot cured, to a slightly higher final cure state than the surrounding material. The range of 5% to 30% degree of cure 126, and in one example, the range of 5% to 10% degree of cure 126, may only have a minor effect, if any, on an interlayer cross-linking with a subsequent layer 58b (see FIGS. 1A, 4E), or ply, and any such minor effect is well within an allowable size for mechanical issues.

The degree of partial cure is controlled as a function of temperature and current cure state based on the time the energy source apparatus 114, for example, the IR heater 118, is turned on, and the rate at which the first head 74 (see FIG. 1B), such as the placement head 74a (see FIGS. 1B, 4C) and/or the second head 112 (see FIGS. 1B, 4C) move to ensure the one or more sections 94 of the composite prepreg material 40 will not be overcured or overheated. This time and rate may be programmed into the CNC CTLM 68 (see FIG. 1B) of the modified automated lamination apparatus 60 and used with software to drive and control the CNC CTLM 68.

In another version, as shown in FIGS. 1A-1B, the section preparation pre-printing apparatus 92 comprises a stamping apparatus 130 configured to perform, and performing, a substrate stamp process 132 on each of the one or more sections 94, or portions, while the stamping apparatus 130 is coupled to, or on, the modified automated lamination apparatus 60, and during the formation of the composite structure 12. The substrate stamp process 132 comprises stamping a substrate material 134 (see FIG. 1B), with the stamping apparatus 130, onto each of the one or more sections 94, or portions, of the composite prepreg material 40 that is uncured, to obtain the one or more prepared sections 96 (see FIG. 1B) comprising one or more stamped substrate sections 96b (see FIG. 1B). The small substrate material 134 is preferably stamped onto the composite prepreg material 40 that is uncured at a location between the compaction roller 88 (see FIG. 2) on the first head 74 (see FIG. 2) that compacts a new layer 58, or ply, of composite prepreg material 40, such as tape 46 or a tow 52, to an existing layer 58, or ply, of composite prepreg material 40, such as tape 46 or a tow 52, and the end of the second head 112 (see FIG. 2).

Each stamped substrate section 96*b* is configured to support, and supports, the one or more printed electronic elements 100 through the region of minimum viscosity of the resin 44. When the resin 44 flows, such resin flow may break a conductive path 136 (see FIG. 1B) of the one or more printed electronic elements 100, and by having the conductive path 136 supported on the substrate material 134, the substrate material 134 avoids, or prevents, breakage of the conductive path 136. The substrate material 134, such as in the form of a substrate support or platform, preferably is of a size that is slightly larger than a size of each of the one or more printed electronic elements 100 that are to be printed on the substrate material 134, on the prepared section 96, such as the stamped substrate section 96*b*. For example, if the substrate material 134, such as in the form of a substrate support or platform, has a width in a range of 15 microns (μ) to 25 microns (μ) wide to receive one or more printed electronic elements 100, the one or more printed electronic elements 100 preferably have a width in a range of 10 microns (μ) to 20 microns (μ) wide. Thus, the size of the substrate material 134, or substrate support or platform, should be slightly larger than the printed electronic elements 100 supported by the substrate material 134 before the substrate material 134 melts, or partially melts.

The substrate material 134 may be chosen so that it is sacrificial, in that it has a low melting point, so that it will melt when the composite structure 12, such as the composite laminate 14, for example, the aircraft composite part 16, undergoes the final cure process 128 with heat at an effective temperature in a range of 330 degrees Fahrenheit (166 degrees Celsius) to 385 degrees Fahrenheit (196 degrees Celsius), and with pressure at an effective pressure in a range of 30 psig (pounds per square inch gauge) to 90 psig, after the one or more printed electronic elements 100 are printed and embedded within the composite structure 12. The substrate material 134 may further be chosen so that it is parasitic, in that it has a very low weight and a very small size (e.g., width of 15-25 microns (μ)), and does not melt, or substantially melt, but is incorporated in the composite structure 12 after the final cure process 128 of the composite structure 12. The substrate material 134 that is parasitic has a very low weight, and when incorporated in the composite structure 12, it preferably does not affect the composite structure 12 formed by the automated lamination system 10. The substrate material 134 may also be chosen so that it is both partially sacrificial and partially parasitic in nature.

Preferably, the substrate material 134 comprises a material having a low melting point, such as less than 315 degrees Fahrenheit (157 degrees Celsius), for example, indium, indium alloys, gallium, gallium alloys, or another suitable substrate material having a low melting point. Indium is a preferred substrate material 134 for the substrate stamp process 132 because indium is solid at room temperature and melts at 313.9 degrees Fahrenheit (156.6 degrees Celsius), and indium is chemically inert with respect to carbon fiber and epoxy resins. For example, for a resin that achieves a 10% degree of cure at 308 degrees Fahrenheit (153 degrees Celsius), when the resin 44 is past its minimum viscosity point in the cure cycle, if the substrate material 134 that is very thin is stamped with the stamping apparatus 130 and melts at this point, the flow of the resin 44 is not going to be sufficient to disrupt the one or more printed electronic materials 100 that will be printed on the substrate material 134. Preferably, the substrate material 134 comprises a material that does not react with the resin 44, that mixes sufficiently with the resin 44, and that melts at the desired low temperature.

As shown in FIGS. 1A-1B, the modified automated lamination apparatus 60 further comprises the non-contact direct write printing apparatus 110 mechanically coupled, or attached, to the section preparation pre-printing apparatus 92. The non-contact direct write printing apparatus 110 preferably comprises an aerosol jet printing apparatus 138 (see FIGS. 1A-1B), or an aerosol jet spraying apparatus, or another suitable non-contact direct write printing apparatus. The non-contact direct write printing apparatus 110, such as the aerosol jet printing apparatus 138, is mechanically coupled, or attached, to the section preparation pre-printing apparatus 92, and together, they may be coupled, or attached, on the second head 112 of the modified automated lamination apparatus 60. In one version, the second head 112 is mechanically attached to the first head 74, such as the placement head 74*a*, of the modified automated lamination apparatus 60. In another version, the second head 112 is separate from the first head 74, such as the placement head 74*a*, of the modified automated lamination apparatus 60.

The non-contact direct write printing apparatus 110, such as in the form of the aerosol jet printing apparatus 138, enables printing of the one or more electronic element materials 98 (see FIGS. 1A-1B), on the prepared sections 96 on the one or more layers 58, such as the top layer 58*a*, of the composite prepreg material 40, and after the sections 94 have undergone either the staged resin process 122 or the substrate stamp process 132, to form the prepared sections 96. The non-contact direct write printing apparatus 110, such as in the form of the aerosol jet printing apparatus 138, comprises one or more printing heads 140 (see FIG. 1B), or deposition heads, for printing in a non-contact direct write printing technique on each of the prepared sections 96, so that each printing head 140 does not directly contact the prepared section 96 while printing. If the prepared section 96 has a three-dimensional geometry, such as a contour or curve, each printing head 140 follows the three-dimensional geometry. As shown in FIG. 1B, the non-contact direct write printing apparatus 110, such as in the form of the aerosol jet printing apparatus 138, further comprises one or more containers 142, or vessels, for storing, mixing, atomizing, dispensing, and/or depositing one or more supplies 97 (see also FIG. 1A) of the electronic element materials 98 (see FIG. 1A).

The one or more supplies 97 of electronic element materials 98, printed with the non-contact direct write printing apparatus 110, on each of the one or more prepared sections 96, may comprise ink 144 (see FIG. 1B), such as nanoparticle ink 144*a* (see FIG. 1B), for example, silver nanoparticle ink, copper nanoparticle ink, or other suitable metal nanoparticle inks. The electronic element materials 98 may further comprise copper and copper foils, silver and silver foils, or other suitable metal materials and metal material foils. The electronic element materials 98 may further comprise non-metal electronic materials, such as ceramics, for example, ceramic-loaded paste to make an insulator, or other suitable non-metal electronic materials. Each electronic element material 98 of the one or more supplies 97 of electronic element materials 98 printed with the aerosol jet printing apparatus 138 preferably has a particle size 146 in a range of 0.001 micron (μ) to 100 microns (μ), and/or has a viscosity 148 in a range of 1 cP (centipoise) to 1000 cP.

In one version, the one or more electronic element materials 98, for example, a metal nanoparticle ink, may be uniformly dispersed, or mixed, in an alcohol-based solvent and placed in a container 142, such as a pneumatic atomizer, to create a dense aerosol of tiny droplets preferably having a particle size 146 in a range of 0.001 micron (μ) to 100 microns (μ), and more preferably, having a particle size 146 in a range of 1 micron (μ) to 5 microns (μ). The aerosol, or atomized particles, of the metal nanoparticle ink may be carried by a gas flow, such as nitrogen, to the one or more printing heads 140, or deposition heads, of the aerosol jet printing apparatus 138. Within the one or more printing heads 140, or deposition heads, the aerosol of the metal nanoparticle ink may be focused by a second gas flow and be deposited in a high velocity stream onto the one or more prepared sections 96, on the top surface 59 of the layer 58, such as the top layer 58*a*, to print and create the one or more printed electronic elements 100. Each printed electronic element 100 preferably has a width in a range of 10 microns (μ) to 20 microns (μ). Different electronic element materials 98 may be stored in different containers 142, or vessels, and then may be separately, or independently, atomized through different tubing to different printing heads 140, or deposition heads.

As shown in FIG. 1B, the one or more printed electronic elements 100 may comprise one or more of, sensors 100*a*, including strain sensors 100*b*, pressure sensors 100*c*, temperature sensors 100*d*, for example, variable resistance temperature sensors, or other suitable sensors, strain gauges 100*e*, traces 100*f*, for example, conductive traces, resistors 100*g*, conductors 100*h*, insulators 100*i*, inductors 100*j*, capacitors 100*k*, transistors 100*l*, solar cells 100*m*, microbatteries 100*n*, circuit elements 100*o*, interconnect elements 100*p*, transducers 100*q*, antennas 100*r*, micro-antennas 100*s*, antenna elements 100*t*, antenna arrays 100*u*, RFID (radio-frequency identification) 100*v*, or other suitable printed electronic elements. The one or more printed electronic elements 100 may be printed on the composite structure 12 where there are prepared sections 96, in which the sections 94 have undergone the staged resin process 122 or the substrate stamp process 132 to become the prepared sections 96, and prior to the final cure process 128 of the composite structure 12. The width of each printed electronic element 100 is preferably in a range of 10 microns (μ) to 20 microns (μ) wide. In contrast, the width of a printed element printed with an ink jet printing apparatus is typically in a range of 50 micron (μ) to 100 micron (μ) wide.

Each printing head 140 of the aerosol jet printing apparatus 138 prints or sprays the one or more electronic element materials 98 directly onto the partially cured surface of each of the one or more prepared sections 96 of the composite prepreg material 40 laid down on the layup tool 55, by depositing the one or more electronic element materials 98, such as copper or other electronically active materials onto the surface. The aerosol jet printing apparatus 138 may print or spray one or more layers of electronic element materials 98 to obtain printed electronic elements 100 that are layered or connected. For example, the aerosol jet printing apparatus 138 may print or deposit electronic element materials 98, such as electronically active materials, to obtain strain sensors 100*b* (see FIG. 1B), temperature sensors 100*d* (see FIG. 1B), such as variable resistance temperature sensors, or pressure sensors 100*c* (see FIG. 1B). Additionally, aerosol jet printing apparatus 138 may print or spray electronic element materials 98 comprising copper, to obtain traces 100*f* (see FIG. 1B), conductors 100*h* (see FIG. 1B), or conductive traces, to provide electrical conductivity to the strain sensors 100*b* (see FIG. 1B), temperature sensors 100*d* (see FIG. 1B), such as variable resistance temperature sensors, and pressure sensors 100*c* (see FIG. 1B). The printed electronic elements 100, such as sensors 100*a*, including strain sensors 100*b*, temperature sensors 100*d*, such as variable resistance temperature sensors, and pressure sensors 100*c*, and the traces 100*f* and conductors 100*h*, are very thin, for example 100 nm (nanometers) thick, and can be printed or deposited on the surface of the prepared sections 96 of the composite prepreg material 40 without resulting in added bulk, and without major impact to mechanical connections between layers 58, or plies. Preferably, the one or more printed electronic elements 100 are printed or deposited in the direction of the fibers 42 (see FIG. 1B) of the composite prepreg material 40 and will have little, to no, effect on the final mechanical properties of the composite structure 12, such as the composite laminate 14, or aircraft composite part 16.

The modified automated lamination apparatus 60 is configured to lay up, and lays up, one or more subsequent layers 58*b* (see FIGS. 1A-1B) of the composite prepreg material 40 over the one or more printed electronic elements 100, to embed the one or more printed electronic elements 100 in the composite structure 12, to obtain one or more embedded printed electronic elements 101 (see FIG. 1A), prior to the composite structure 12 undergoing the final cure process 128 (see FIG. 1B). For example, a subsequent layer 58*b* of composite prepreg material 40, such as a carbon ply, is placed over the printed electronic element 100, such as a sensor 100*a*, to embed the sensor 100*a* into the layers 58 of composite prepreg material 40. When the composite structure 12, such as the aircraft composite part 16, is cured, such as undergoing the final cure process 128, the one or more printed electronic elements 100 each maintain a mechanical stability 150 (see FIG. 1A). Although it is preferable to print and embed the one or more printed electronic elements 100 inside the composite structure 12, it is also possible to print the one or more printed electronic elements on the top surface of the composite structure 12, prior to the final cure process 128.

The composite structure 12 with the one or more printed electronic elements 100 embedded on interior portions 30 of the interior 28 of the composite structure 12, or printed on the top surface of the composite structure 12, may be cured, such as fully and finally cured with the final cure process 128, with sufficient heat and sufficient pressure. A known vacuum bagging assembly and process may be used in the final cure process 128, or another suitable final cure process assembly, system, and method may be used. The one or more printed electronic elements 100, such as one or more embedded printed electronic elements 101, may be used for data collection 32 (see FIG. 1A) and/or structural health monitoring 34 (see FIG. 1A) of the composite structure 12, such as the aircraft composite part 16. Data collection 32 may enable design improvements in aircraft 18 or other vehicles to be built. Structural health monitoring 34 may enable detection of changes in stiffness in a composite structure 12, such as an aircraft composite part 16, that may, in turn, indicate needed maintenance.

As shown in FIGS. 1A-1B, the automated lamination system 10 further comprises the control system 78 coupled to the modified automated lamination apparatus 60. The control system 78 is configured to control, and controls one or more operations 152 (see FIG. 1B) of the modified automated lamination apparatus 60. As shown in FIG. 1B, the control system 78 comprises a controller 154 and one or more computers 76. The controller 154 is configured to identify, and identifies, a location for placing the composite prepreg material 40 on the layup tool 55 of the layup tool assembly 54, and is configured to direct, and directs, the modified automated lamination apparatus 60 to lay up the composite prepreg material 40 to form the composite structure 12, such as the composite laminate 14, at the location. In one version, the control system 78 may be incorporated into the computer numerically controlled (CNC) CTLM 68.

As shown in FIGS. 1A-1B, the automated lamination system 10 further comprises a power system 156 coupled to the modified automated lamination apparatus 60. The power system 156 comprises a power source 158 (see FIG. 1B) that is configured to provide, and provides, power to the modified automated lamination apparatus 60 of the automated lamination system 10. The power source 158 of the power system 156 may comprise a battery, electric power, an electric motor, or another suitable power source. The power system 156 may be coupled to the modified automated lamination apparatus 60, via one or more wired connections 160 (see FIG. 1B), or via a wireless connection 162 (see FIG. 1B). Similarly, the control system 78 may be coupled to the modified automated lamination apparatus 60, via the same, or separate, wired connections 160 (see FIG. 1B), or via the same, or separate, wireless connection 162 (see FIG. 1B).

Figure 2:
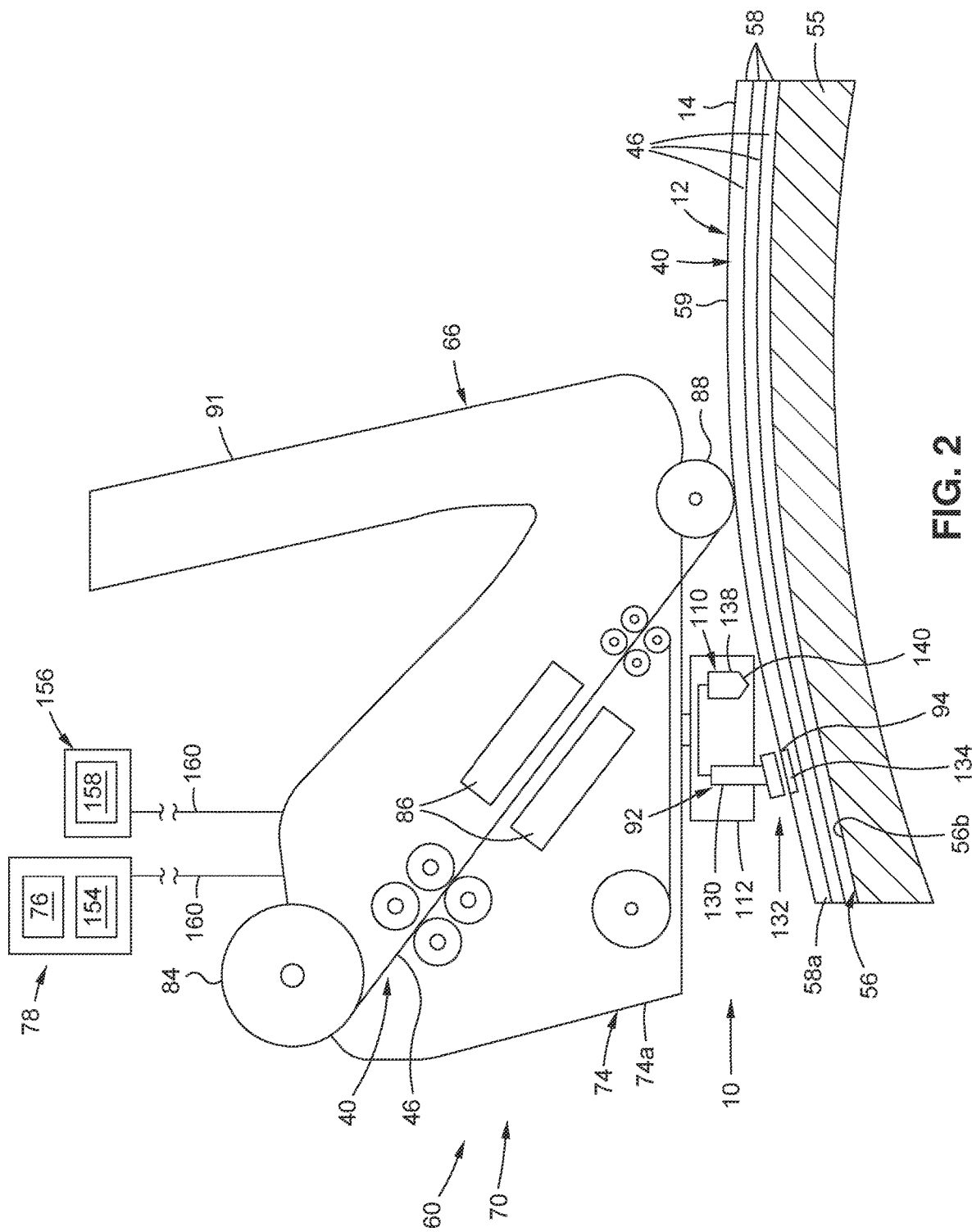
FIG. 2 is an illustration of a side view of an exemplary version of a modified automated lamination apparatus of the disclosure.

Now referring to FIG. 2, FIG. 2 is an illustration of a side view of an exemplary version of a modified automated lamination apparatus 60, such as in the form of the modified automated tape laying apparatus 70, of the disclosure. As shown in FIG. 2, the modified automated lamination apparatus 60 comprises a composite tape laying machine (CTLM) 66 that has been modified with the addition of a section preparation pre-printing apparatus 92 and a non-contact direct write printing apparatus 110. As further shown in FIG. 2, the section preparation pre-printing apparatus 92 is in the form of a stamping apparatus 130, and the non-contact direct write printing apparatus 110 is in the form of aerosol jet printing apparatus 138. As further shown in FIG. 2, the stamping apparatus 130 and the aerosol jet printing apparatus 138 are mechanically connected together on a second head 112, and the second head 112 is attached to the first head 74, such as the placement head 74a, on the modified automated lamination apparatus 60. In another version, the second head 112 may be separate and not attached to the first head 74.

As shown in FIG. 2, the modified automated lamination apparatus 60 further comprises one or more spools 84 for feeding the composite prepreg material 40, in the form of tape 46, through the modified automated lamination apparatus 60, such as the composite tape laying machine (CTLM) 66 that has been modified, and to the one or more compaction rollers 88 that dispense and compact or consolidate the tape 46 as it is placed, or laid down, on the layup tool 55. As shown in FIG. 2, the modified automated lamination apparatus 60 further comprises a heater 86, such as a radiative heater, for example, an infrared (IR) heater, for heating the composite prepreg material 40, such as the tape 46, and for heating the composite structure 12, such as the composite laminate 14, during the final cure process 128 (see FIG. 1B). This heater 86 is a separate individual heater than the energy source apparatus 114 (see FIGS. 1B, 4B) that may be added to the modified automated lamination apparatus 60. The energy source apparatus 114, such as the IR heater 118 (see FIG. 1B), is added for the purpose of performing the localized partial cure operation 124 (see FIG. 1B) on the one or more sections 94 (see FIGS. 1A-1B) on the one or more layers 58 of the composite prepreg material 40 forming the composite structure 12, to obtain the one or more prepared sections 96 (see FIGS. 1A-1B), comprising the one or more localized partially cured sections 96a (see FIG. 1B). As shown in FIG. 2, the modified automated lamination apparatus 60 further comprises a gantry 91 for suspending the modified automated lamination apparatus 60 above the layup tool 55.

FIG. 2 further shows the layers 58 of composite prepreg material 40, such as tape 46, placed, or laid down, and stacked on the layup tool 55. As shown in FIG. 2, the surface 56 of the layup tool 55 is a contoured surface 56b, or curved surface. FIG. 2 shows the stamping apparatus 130 performing the substrate stamp process 132 by stamping a substrate material 134 on a section 94 on the top surface 59 of the top layer 58a of the layers 58 of the composite prepreg material 40, such as the tape 46, that is uncured and that forms the composite structure 12, such as the composite laminate 14.

FIG. 2 further shows the modified automated lamination apparatus 60 coupled, or connected, via a wired connection 160, to the control system 78 having the computer 76 and the controller 154. FIG. 2 further shows the modified automated lamination apparatus 60 coupled, or connected, via a wired connection 160, to the power system 156 having the power source 158.

Figure 3:
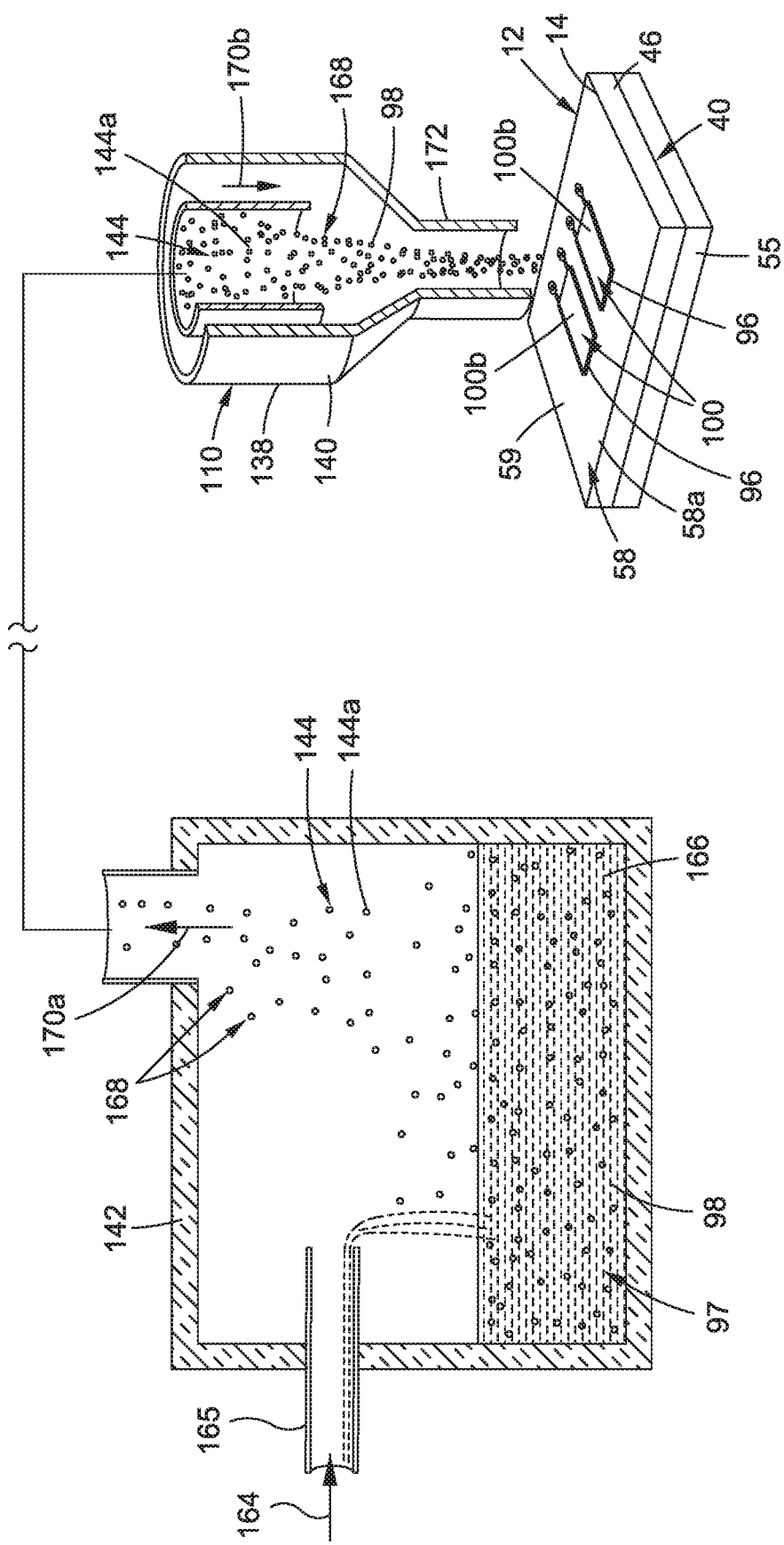
FIG. 3 is an illustration of a side view of an exemplary version of an aerosol jet printing apparatus that may be incorporated in a version of a modified automated lamination apparatus of the disclosure.

Now referring to FIG. 3, FIG. 3 is an illustration of a side view of a version of a non-contact direct write printing apparatus 110, such as an aerosol jet printing apparatus 138, that may be incorporated in a version of the modified automated lamination apparatus 60 (see FIGS. 1B, 2) of the disclosure. As shown in FIG. 3, the non-contact direct write printing apparatus 110, such as in the form of the aerosol jet printing apparatus 138, comprises a printing head 140, or deposition head, for printing in a non-contact direct write printing technique on each of the prepared sections 96 on the top surface 59 of the top layer 58a of the layers 58 of the composite structure 12, such as the composite laminate 14, so that the printing head 140 does not directly contact the prepared sections 96 while printing. As shown in FIG. 3, the non-contact direct write printing apparatus 110, such as in the form of the aerosol jet printing apparatus 138, is coupled to a container 142, or vessel, for mixing, atomizing, and dispensing the supply 97 of the electronic element materials 98 to the aerosol jet printing apparatus 138. As shown in FIG. 3, the container 142 may be located remotely from the aerosol jet printing apparatus 138. Alternatively, the container 142 may be located on the modified automated lamination apparatus 60 near the aerosol jet printing apparatus 138.

As shown in FIG. 3, the supply 97 of electronic element material 98 is transferred from a reservoir source 164, via an inlet 165, into the container 142. As shown in FIG. 3, the supply 97 of electronic element material 98 comprises ink 144, such as nanoparticle ink 144a, for example, silver nanoparticle ink, that is mixed in the container 142 with a solvent 166, such as an alcohol-based solvent, and is pneumatically atomized to create aerosol droplets 168 of the ink 144, such as the nanoparticle ink 144a. The aerosol droplets 168 of the ink 144, such as the nanoparticle ink 144a, are carried by a first nitrogen gas flow 170a (see FIG. 3) to the printing head 140, or deposition head. Within the printing head 140, or deposition head, of the aerosol jet printing apparatus 138, the aerosol droplets 168 of the ink 144, such as the nanoparticle ink 144a, are focused by a second nitrogen gas flow 170b and deposited through a nozzle tip 172 in a high velocity stream onto the prepared sections 96 on the top surface 59 of the layer 58, such as the top layer 58*a*, of the composite structure 12, such as the composite laminate 14, placed, or laid up, on the layup tool 55, to print and create the printed electronic elements 100.

FIG. 3 shows the aerosol jet printing apparatus 138 printing two printed electronic elements 100, in the form of two strain sensors 100*b*, on the top surface 59 of the top layer 58*a* of the layers 58 of the composite prepreg material 40. FIG. 3 shows one version of the non-contact direct write printing apparatus 110, such as the aerosol jet printing apparatus 138, that may be mechanically coupled, or connected, to the section preparation pre-printing apparatus 92, and added to, and used on, the modified automated lamination apparatus 60. However, another suitable non-contact direct write printing apparatus 110 may also be used.

Now referring to FIGS. 4A-4E show schematic diagrams of various stages of forming a composite structure 12, such as a composite laminate 14, with an embedded printed electronic element 101 using a version of an automated lamination system 10 of the disclosure.

Figure 4A:
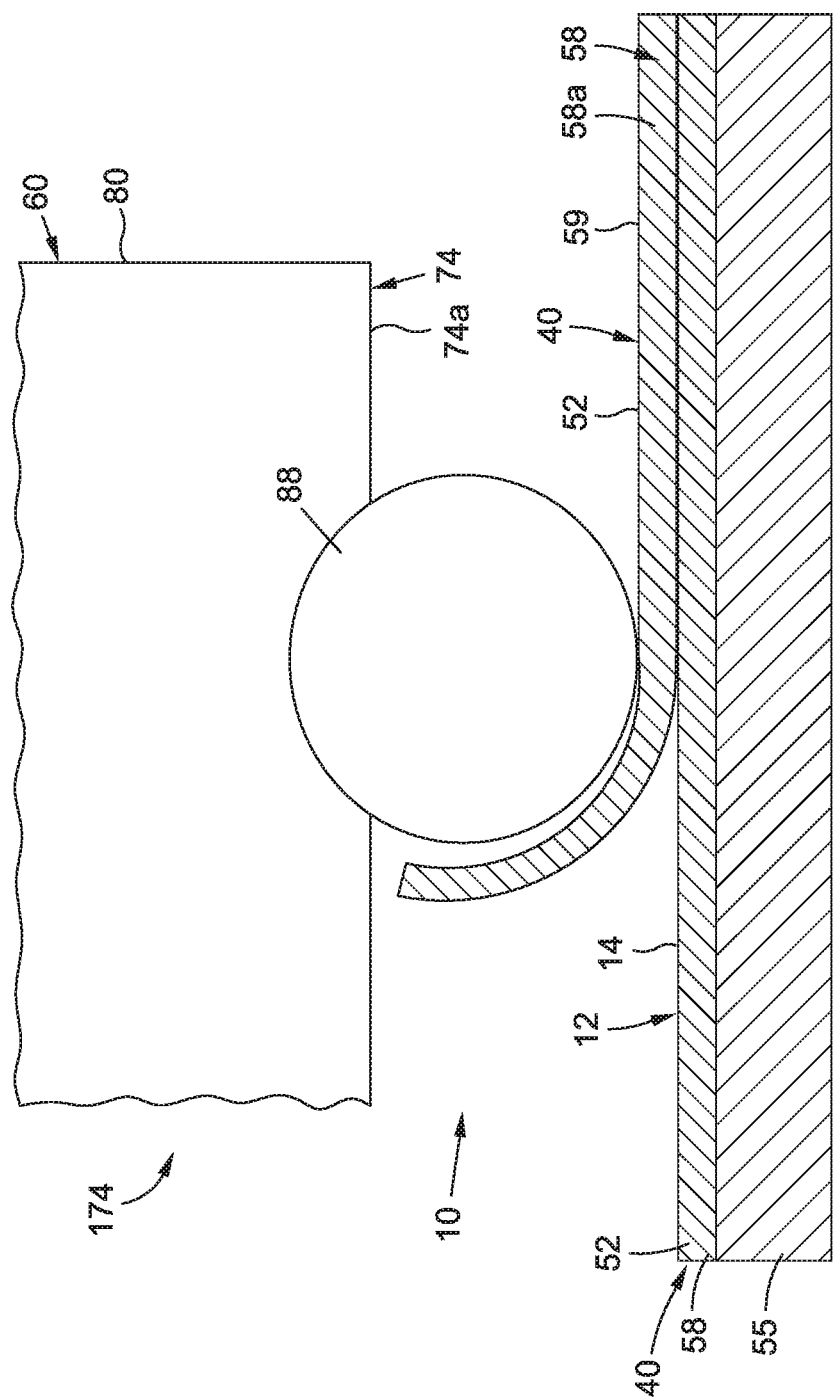
FIG. 4A is a schematic diagram showing a top layer layup stage of laying up a top layer of composite prepreg material using a version of the automated lamination system of the disclosure.

Now referring to FIG. 4A, FIG. 4A is a schematic diagram showing a top layer layup stage 174 of laying up a top layer 58*a* of composite prepreg material 40 using a version of the automated lamination system 10 of the disclosure. As shown in FIG. 4A, the top layer 58*a* of the layers 58 of composite prepreg material 40, such as in the form of a tow 52, is being placed, or laid up, over another layer 58 of composite prepreg material 40, such as in the form of a tow 52, which is laid up on the layup tool 55. FIG. 4A shows a compaction roller 88 on the first head 74, such as the placement head 74*a*, of the modified automated lamination apparatus 60, such as in the form of a modified automated fiber placement apparatus 80, rolling along the top surface 59 of the top layer 58*a*, and compacting, or consolidating, the top layer 58*a*, over the composite structure 12, such as the composite laminate 13.

Figure 4B:
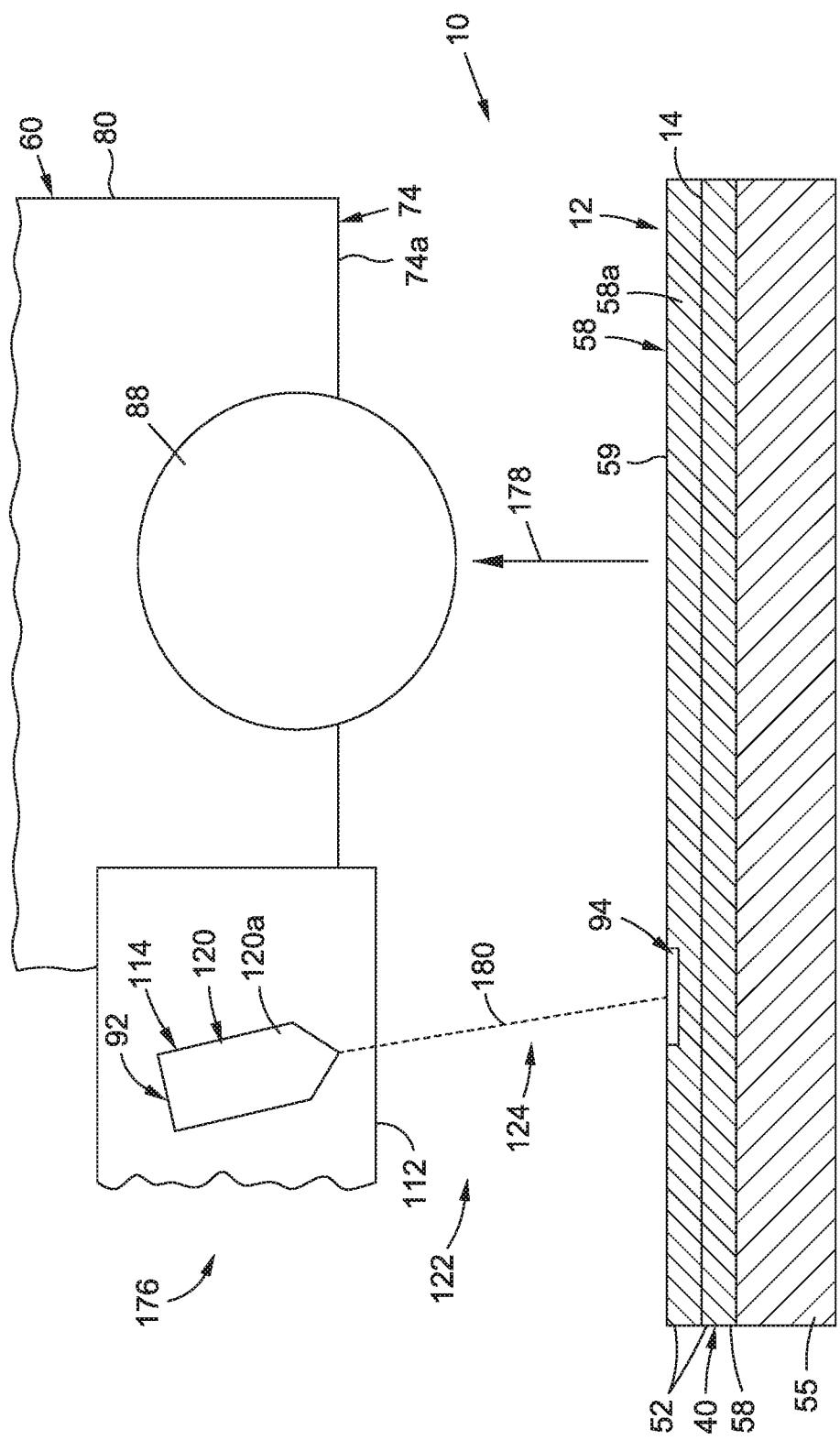
FIG. 4B is a schematic diagram showing a localized partial curing stage using a section preparation pre-printing apparatus used in a version of the automated lamination system of the disclosure.

Now referring to FIG. 4B, FIG. 4B is a schematic diagram showing a localized partial curing stage 176 using a section preparation pre-printing apparatus 92, such as in the form of an energy source apparatus 114, for example, a laser apparatus 120, such as a laser gun 120*a*, used in a version of the automated lamination system 10 of the disclosure. As shown in FIG. 4B, the compaction roller 88 on the first head 74, such as the placement head 74*a*, of the modified automated lamination apparatus 60, such as in the form of a modified automated fiber placement apparatus 80, is moved in an upward direction 178 away from the layer 58, such as the top layer 58*a*, comprised of the composite prepreg material 40, such as in the form of the tow 52, that has been laid down over the one or more layers 58 under the top layer 58*a*. The formed composite structure 12, such as the composite laminate 14, is laid up over the layup tool 55. As further shown in FIG. 4B, the section preparation pre-printing apparatus 92, such as in the form of an energy source apparatus 114, is positioned on the second head 112, which is coupled, or attached, to the first head 74, such as the placement head 74*a*, of the modified automated lamination apparatus 60, such as in the form of a modified automated fiber placement apparatus 80. As further shown in FIG. 4B, the section preparation pre-printing apparatus 92, such as in the form of an energy source apparatus 114, comprising the laser apparatus 120, such as the laser gun 120*a*, performs a staged resin process 122. As further shown in FIG. 4B, the staged resin process 122 comprises performing a localized partial cure operation 124, using a laser beam 180 from the laser apparatus 120, such as the laser gun 120*a*, to partially cure a section 94, or portion, on the top surface 59 of the top layer 58*a*, to a degree of cure 126 (see FIG. 1B) in a range of 5% to 30%, and in one example, in a range of 5% to 10%, to obtain one or more prepared sections 96 (see FIG. 4C). The section 94 preferably has a width 104 in a range of 10 microns (µ) to 20 microns (µ).

Figure 4C:
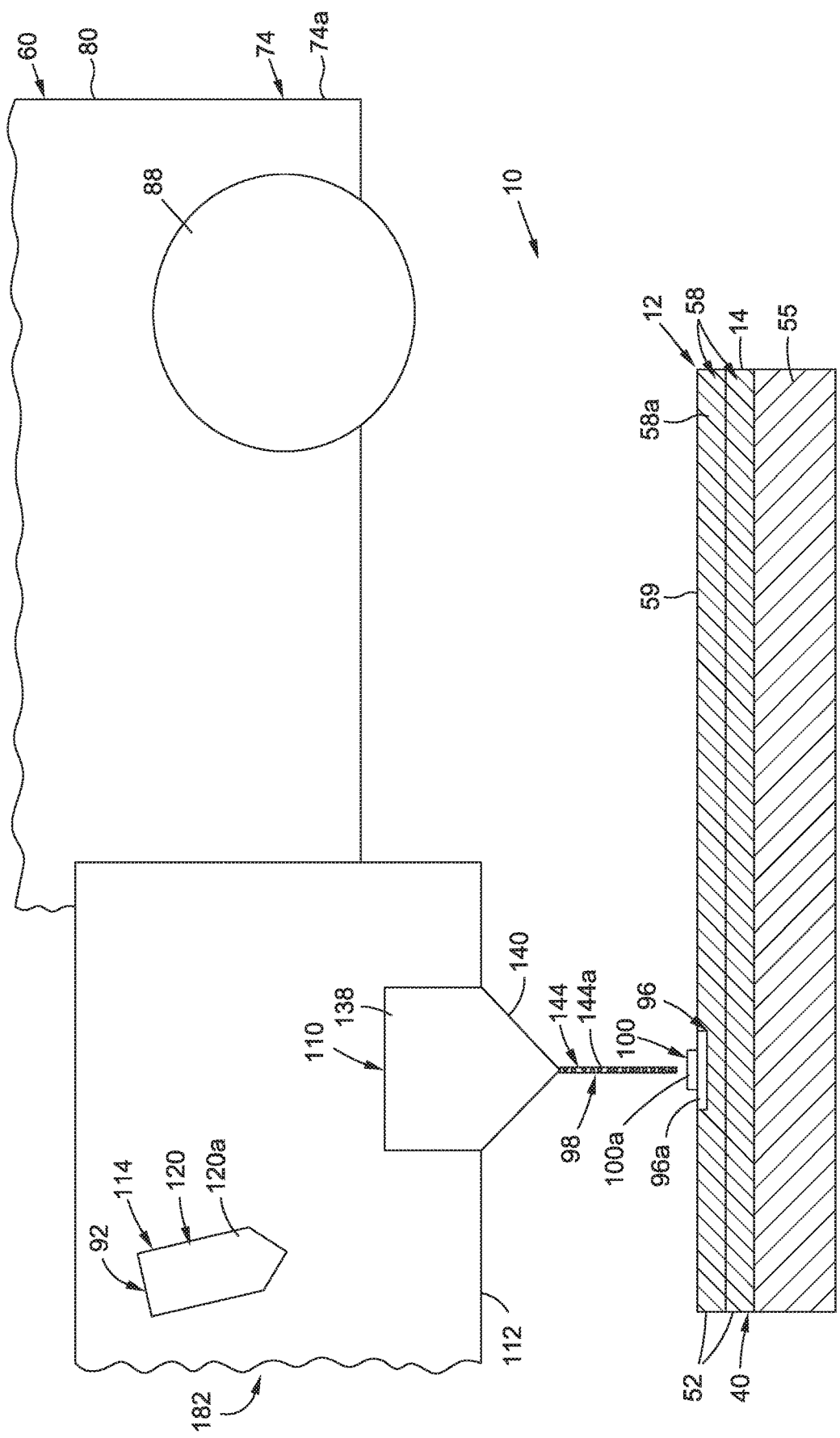
FIG. 4C is a schematic diagram showing a printing stage using a non-contact direct write printing apparatus used in a version of the automated lamination system of the disclosure.

Now referring to FIG. 4C, FIG. 4C is a schematic diagram showing a printing stage 182 using a non-contact direct write printing apparatus 110, such as in the form of an aerosol jet printing apparatus 138, used in a version of the automated lamination system 10 of the disclosure. As further shown in FIG. 4C, non-contact direct write printing apparatus 110, such as in the form of an aerosol jet printing apparatus 138, is mechanically coupled, on the second head 112, to the section preparation pre-printing apparatus 92, such as in the form of an energy source apparatus 114, for example, the laser apparatus 120, such as the laser gun 120*a*. The second head 112 is coupled, or attached, to the first head 74, such as the placement head 74*a*, of the modified automated lamination apparatus 60, such as in the form of a modified automated fiber placement apparatus 80. As further shown in FIG. 4C, non-contact direct write printing apparatus 110, such as in the form of an aerosol jet printing apparatus 138, comprises a printing head 140 for dispensing and printing electronic element material 98, such as in the form of ink 144, for example, nanoparticle ink 144*a*, onto the prepared section 96, such as the localized partially cured section 96*a*, to create and print one or more printed electronic elements 100 on the top surface 59 of the top layer 58*a* of the layers 58 of composite prepreg material 40, in the form of tows 52. FIG. 4C further shows the composite structure 12, such as the composite laminate 14, laid up over the layup tool 55, and shows the compaction roller 88 still moved off of the top layer 58*a*. The one or more printed electronic elements 100 may comprise a single layer, such as a sensor 100*a*, or multiple layers with different materials and a top protection layer.

Figure 4D:
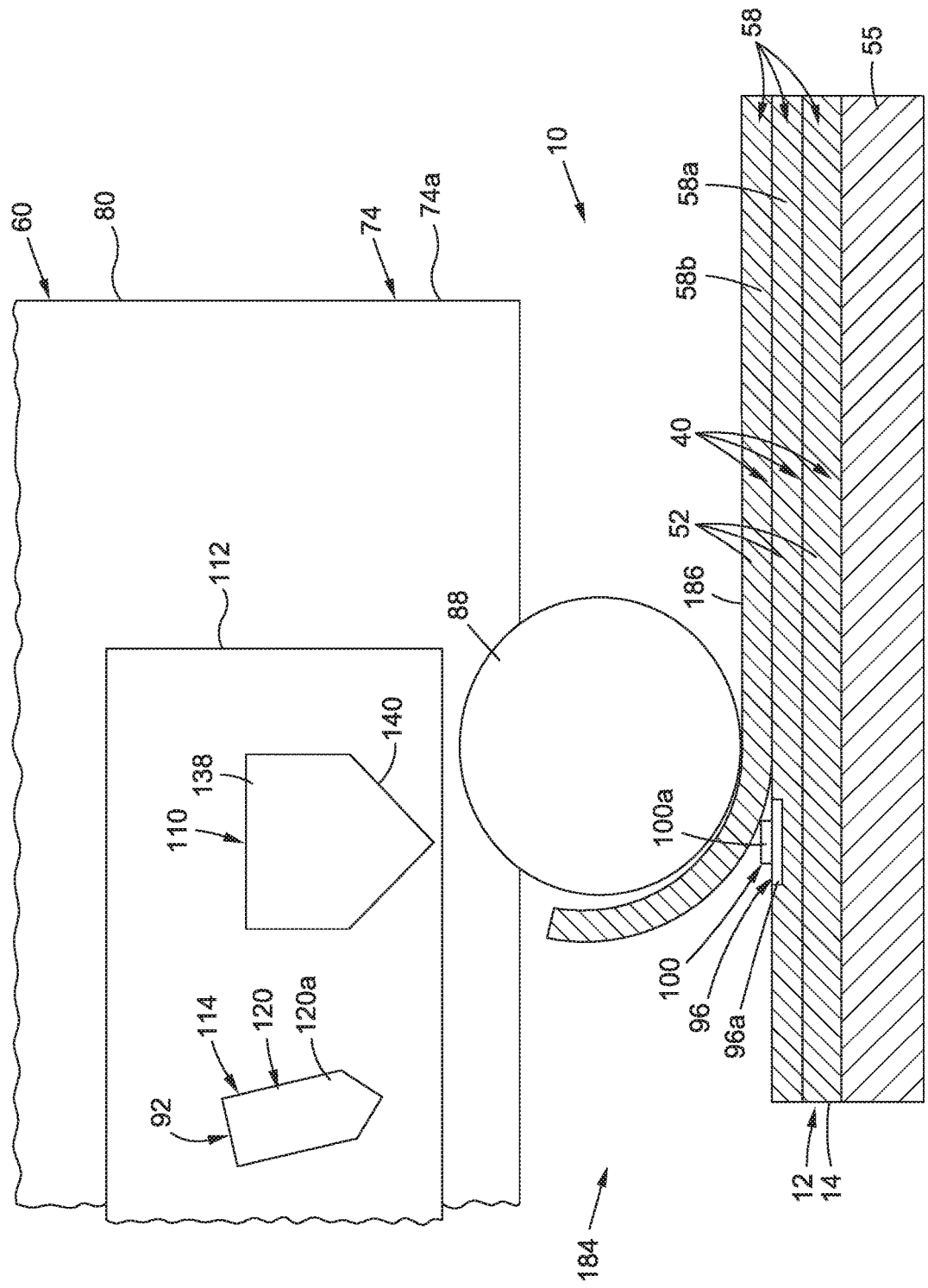
FIG. 4D is a schematic diagram showing a subsequent layer layup stage of laying up a subsequent layer of composite prepreg material over one or more printed electronic elements using a version of the automated lamination system of the disclosure.

Now referring to FIG. 4D, FIG. 4D is a schematic diagram showing a subsequent layer layup stage 184 of laying up a subsequent layer 58*b* of the layers 58 of composite prepreg material 40 over the one or more printed electronic elements 100 using a version of the automated lamination system 10 of the disclosure. As shown in FIG. 4D, the subsequent layer 58*b* of the layers 58 of composite prepreg material 40, such as in the form of tows 52, is being placed, or laid up, over the previous top layer 58*a* of composite prepreg material 40. The composite structure 12, such as the composite laminate 14, that is formed, is laid up over the layup tool 55. FIG. 4D shows the compaction roller 88 on the first head 74, such as the placement head 74*a*, of the modified automated lamination apparatus 60, such as in the form of a modified automated fiber placement apparatus 80, rolling along a top surface 186 of the subsequent layer 58*b*, and compacting, or consolidating, the subsequent layer 58*b*, over the previous top layer 58*a*, which has the printed electronic element 100, such as the sensor 100*a*, printed on the prepared section 96, such as the localized partially cured section 96*a*. FIG. 4D further shows the second head 112 coupled, or attached, to the first head 74. FIG. 4D further shows the section preparation pre-printing apparatus 92, such as the energy source apparatus 114, for example, the laser apparatus 120, comprising the laser gun 120*a*, mechanically coupled to the non-contact direct write printing apparatus 110, such as the aerosol jet printing apparatus 138, with the printing head 140.

Figure 4E:
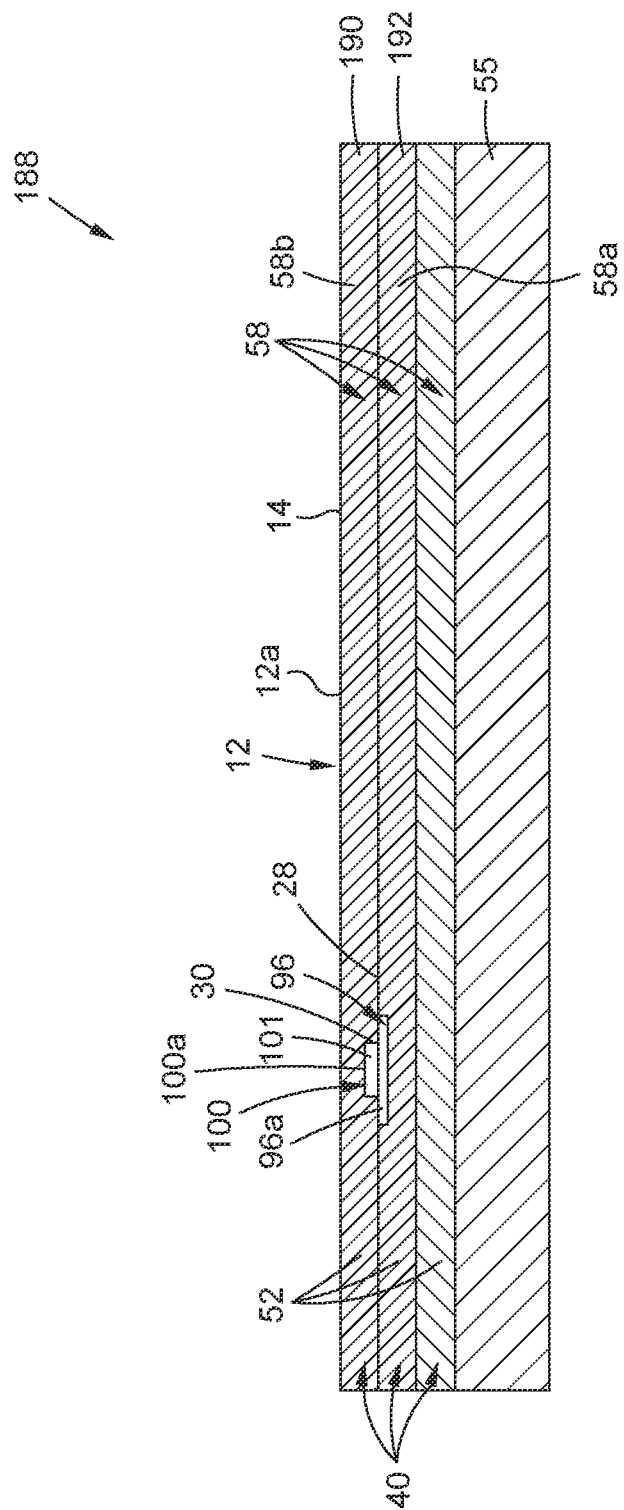
FIG. 4E is a schematic diagram showing a formed composite structure stage, where a printed electronic element is embedded in a formed composite structure.

Now referring to FIG. 4E, FIG. 4E is a schematic diagram showing a formed composite structure stage 188, where the printed electronic element 100 is embedded in the composite structure 12, such as a formed composite structure 12a. As shown in FIG. 4E, the formed composite structure 12a comprises the subsequent layer 58b of the layers 58 of composite prepreg material 40, such as the tows 52, laid over the previous top layer 58a, and laid over the printed electronic element 100, such as the sensor 100a, to obtain an embedded printed electronic element 101. As further shown in FIG. 4E, the subsequent layer 58b is now a final top layer 190, and the previous top layer 58a is now a second layer 192 underneath the final top layer 190. As further shown in FIG. 4E, the printed electronic element 100 comprising the embedded printed electronic element 101 is embedded at an interior portion 30 of an interior 28 of the composite structure 12, such as the formed composite structure 12a. As further shown in FIG. 4E, the composite structure 12, such as the formed composite structure 12a, for example, the composite laminate 14, is laid up over the layup tool 55. The printed electronic element 100, such as the embedded printed electronic element 101, is embedded in the composite structure 12, such as the formed composite structure 12a, prior to the composite structure 12 undergoing the final cure process 128 (see FIG. 1B). When the composite structure 12, such as the formed composite structure 12a, is cured, the one or more printed electronic elements 100 each maintain a mechanical stability 150 (see FIG. 1A).

Figure 5:
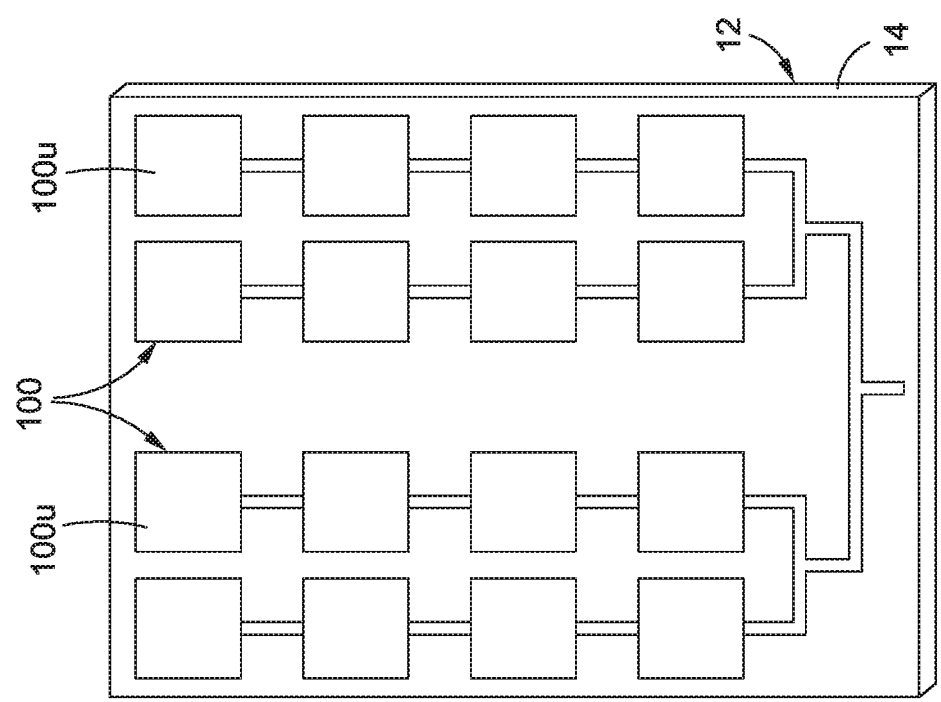
FIG. 5 is an illustration of a top perspective view of an exemplary version of a printed electronic element, in the form of an antenna array, printed on a composite structure.

Now referring to FIG. 5, FIG. 5 is an illustration of a top perspective view of an exemplary version of a printed electronic element 100, in the form of an antenna array 100u, for example, an X-band microstrip antenna array, that has been printed on a composite structure 12, such as a composite laminate 14. The antenna array 100u is formed of an ink 144 (see FIG. 1B), such as a nanoparticle ink 144a (see FIG. 1B), that is deposited, via the non-contact direct write printing apparatus 110 (see FIGS. 1A-1B, 3), such as the aerosol jet printing apparatus 138 (see FIGS. 1A-1B, 3), on the composite structure 12.

Figure 6:
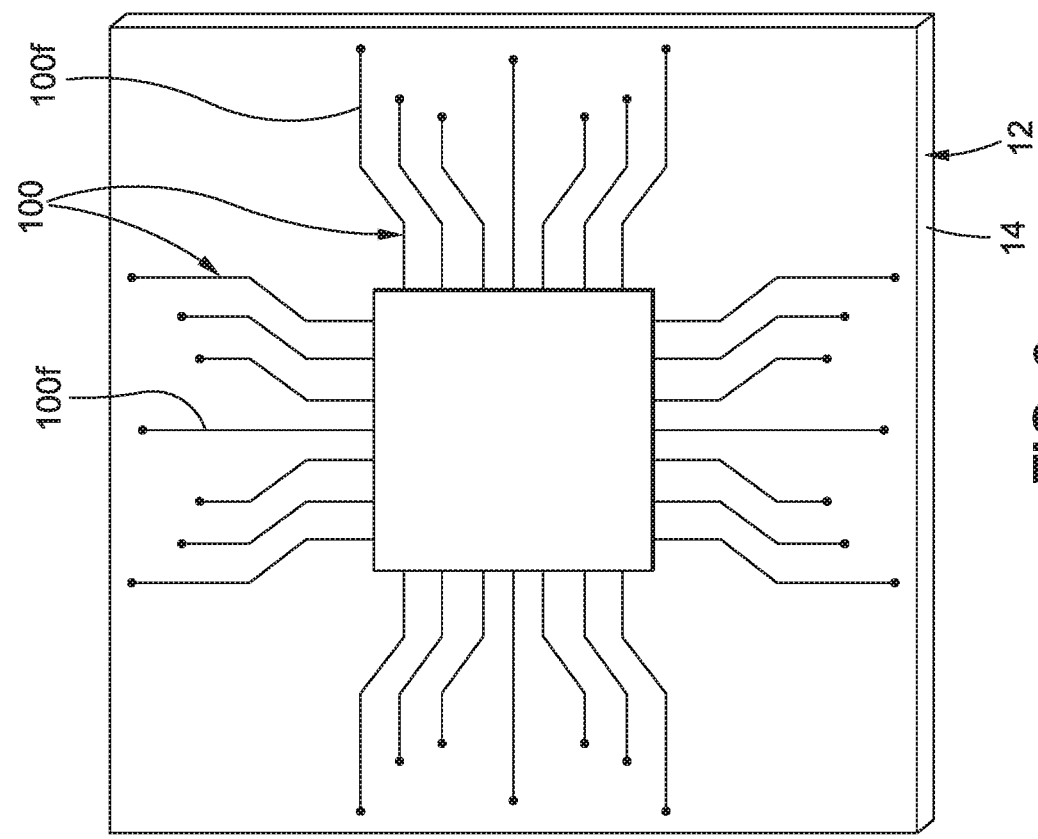
FIG. 6 is an illustration of a top perspective view of an exemplary version of printed electronic elements, in the form of traces, printed on a composite structure.

Now referring to FIG. 6, FIG. 6 is an illustration of a top perspective view of an exemplary version of printed electronic elements 100, in the form of traces 100f, that have been printed on a composite structure 12, such as a composite laminate 14. The traces 100f are formed of an ink 144 (see FIG. 1B), such as a nanoparticle ink 144a (see FIG. 1B), that is deposited via the non-contact direct write printing apparatus 110 (see FIGS. 1A-1B, 3), such as the aerosol jet printing apparatus 138 (see FIGS. 1A-1B, 3), on the composite structure 12.

Figure 7:
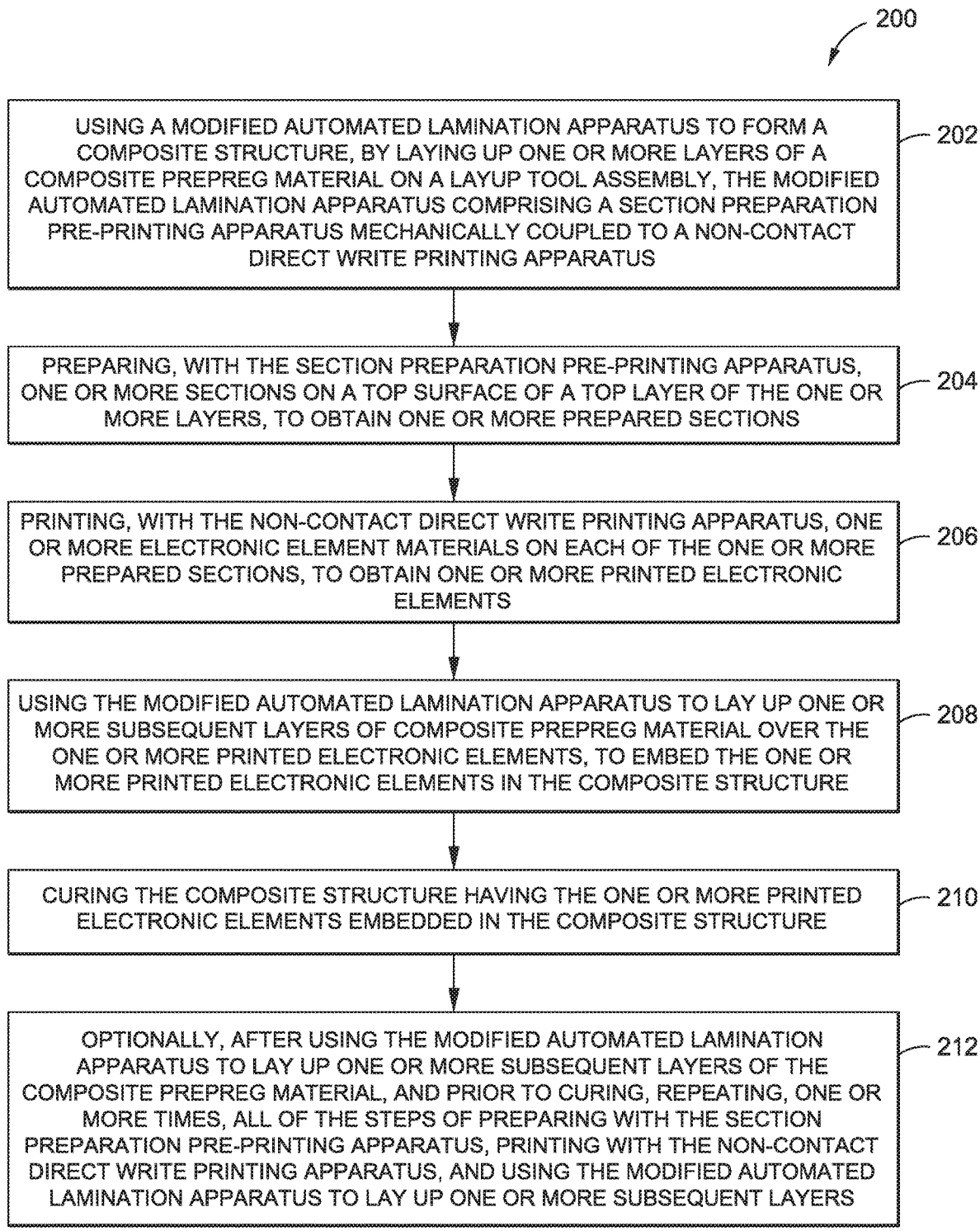
FIG. 7 is an illustration of a flow diagram of a version of an automated lamination method of the disclosure.

Now referring to FIG. 7, FIG. 7 is an illustration of a flow diagram of a version of an automated lamination method 200 of the disclosure. In another version of the disclosure, there is provided the automated lamination method 200 (see FIG. 7) for embedding one or more printed electronic elements 100 (see FIGS. 1A-1B) in a composite structure 12 (see FIGS. 1A-1B), such as a composite laminate 14 (see FIG. 1B), an aircraft composite part 16 (see FIG. 1B), or another suitable composite structure.

The blocks in FIG. 7 represent operations and/or portions thereof, or elements, and lines connecting the various blocks do not imply any particular order or dependency of the operations or portions thereof, or elements. FIG. 7 and the disclosure of the steps of the automated lamination method 200 set forth herein should not be interpreted as necessarily determining a sequence in which the steps are to be performed. Rather, although one illustrative order is indicated, it is to be understood that the sequence of the steps may be modified when appropriate. Accordingly, certain operations may be performed in a different order or simultaneously.

As shown in FIG. 7, the automated lamination method 200 comprises the step 202 of using a modified automated lamination apparatus 60 (see FIGS. 1A-1B) to form the composite structure 12, by laying up one or more layers 58 (see FIGS. 1A-1B) of a composite prepreg material 40 (see FIGS. 1A-1B) on a layup tool assembly 54 (see FIGS. 1A-1B). The layup tool assembly comprises a layup tool 55 (see FIG. 1B), for example, a mold, a mandrel, or another suitable layup tool. The layup tool 55 has a surface 56 (see FIG. 1B) that may comprise a planar surface 56a (see FIG. 1B) or a contoured surface 56b (see FIG. 1B). The modified automated lamination apparatus 60 comprises a section preparation pre-printing apparatus 92 (see FIGS. 1A-1B) mechanically coupled to a non-contact direct write printing apparatus 110 (see FIGS. 1A-1B). The step 202 of using the modified automated lamination apparatus 60 to form the composite structure 12, further comprises using the modified automated lamination apparatus 60 comprising one of, a modified automated tape laying apparatus 70 (see FIG. 1B), and a modified automated fiber placement apparatus 80 (see FIG. 1B).

As shown in FIG. 7, the automated lamination method 200 further comprises the step 204 of preparing, with the section preparation pre-printing apparatus 92 (see FIGS. 1A-1B), one or more sections 94 (see FIGS. 1A-1B) on a top surface 59 (see FIGS. 1A-1B) of a top layer 58a (see FIGS. 1A-1B) of the one or more layers 58, to obtain one or more prepared sections 96 (see FIGS. 1A-1B). The step 204 of preparing, with the section preparation pre-printing apparatus 92, the one or more sections 94, may further comprise preparing, with the section preparation pre-printing apparatus 92, the one or more sections 94 each having a size 102 (see FIG. 1B) preferably having a width 104 (see FIG. 1B) in a range of 10 microns (μ) to 20 microns (μ), and preferably having a length 106 (see FIG. 1B) in a range of 10 microns (μ) to 10 meters (m), such as in one example, a length 106 in a range of 10 microns (μ) to 20 microns (μ), and in another example, a length 106 in a range of 0.01 meter (10 centimeters) to 10 meters (1000 centimeters), and preferably having a thickness 108 (see FIG. 1B) in a range of 0.01 micron (μ) (10 nanometers (nm)) to 0.1 micron (μ) (100 nanometers (nm)). Where each of the one or more sections 94 has a length 106 in a range of 0.01 meter to 10 meters, this length 106 may be for a section 94 for a continuous conductive path to a location on the composite structure 12, such as the aircraft composite part 16, designated for interface with an external electronic system.

In one version, the step 204 of preparing, with the section preparation pre-printing apparatus 92, may further comprise preparing with the section preparation pre-printing apparatus 92 comprising an energy source apparatus 114 (see FIGS. 1A-1B) comprising a radiative heater 116 (see FIG. 1B), such as an infrared (IR) heater 118 (see FIG. 1B), a laser apparatus 120 (see FIG. 1B), such as a laser gun 120a (see FIG. 1B), or another suitable energy source apparatus, and performing a staged resin process 122 (see FIGS. 1A-1B) on each of the one or more sections 94 with the energy source apparatus 114, while the energy source apparatus 114 is coupled to the modified automated lamination apparatus 60 and the composite structure 12 is being formed.

The staged resin process 122 comprises performing a localized partial cure operation 124 (see FIG. 1B) to a degree of cure 126 (see FIG. 1B) in a range of 5% to 30%, and in one example, in a range of 5% to 10%, to obtain the one or more prepared sections 96 comprising one or more localized partially cured sections 96a (see FIG. 1B). The resin 44 (see FIG. 1B) is preferably staged on the top surface 59 of the top layer 58a, or ply, and not all the way through the thickness of the top layer 58a, or ply, or through the thickness of the layers 58 under the top layer 58a.

In another version, the step 204 of preparing, with the section preparation pre-printing apparatus 92, may further comprise preparing with the section preparation pre-printing apparatus 92 comprising a stamping apparatus 130 (see FIGS. 1A-1B) performing a substrate stamp process 132 (see FIGS. 1A-1B) on each of the one or more sections 94, while the stamping apparatus 130 is coupled to the modified automated lamination apparatus 60 and the composite structure 12 is being formed. The substrate stamp process 132 comprises stamping a substrate material 134 (see FIG. 1B), with the stamping apparatus 130, onto each of the one or more sections 94, to obtain the one or more prepared sections 96 comprising one or more stamped substrate sections 96b (see FIG. 1B). Each stamped substrate section 96b is configured to support, and supports, the one or more electronic element materials 98 and the printed electronic elements 100, prior to, and after the final cure process 128 (see FIG. 1B).

As shown in FIG. 7, the automated lamination method 200 further comprises the step 206 of printing, with the non-contact direct write printing apparatus 110, one or more electronic element materials 98 (see FIGS. 1A-1B) on each of the one or more prepared sections 96, to obtain the one or more printed electronic elements 100 (see FIGS. 1A-1B).

The step 206 of printing, with the non-contact direct write printing apparatus 110, the one or more electronic element materials 98 on each of the one or more prepared sections 96, may further comprise printing, with the non-contact direct write printing apparatus 110 comprising an aerosol jet printing apparatus 138 (see FIGS. 1A-1B), and where the one or more electronic element materials 98 each having a particle size 146 (see FIG. 1B) in a range of 0.001 micron (µ) to 100 microns (µ), and/or each having a viscosity 148 (see FIG. 1B) in a range of 1 cP (centipoise) to 1000 cP.

The step 206 of printing, with the non-contact direct write printing apparatus 110, such as the aerosol jet printing apparatus 138, the one or more electronic element materials 98 on each of the one or more prepared sections 96, may further comprise printing with the non-contact direct write printing apparatus 110, such as the aerosol jet printing apparatus 138, the one or more electronic element materials 98 on each of the one or more prepared sections 96, to obtain one or more printed electronic elements 100 comprising one or more of, as shown in FIG. 1B, sensors 100a, including strain sensors 100b, pressure sensors 100c, temperature sensors 100d, for example, variable resistance temperature sensors, or other suitable sensors, strain gauges 100e, traces 100f, for example, conductive traces, resistors 100g, conductors 100h, insulators 100i, inductors 100j, capacitors 100k, transistors 100l, solar cells 100m, micro-batteries 100n, circuit elements 100o, interconnect elements 100p, transducers 100q, antennas 100r, micro-antennas 100s, antenna elements 100t, antenna arrays 100u, RFID (radio-frequency identification) 100v, or other suitable printed electronic elements. The one or more printed electronic elements 100 are preferably printed on the prepared sections 96 obtained after the sections 94 have undergone the staged resin process 122 or the substrate stamp process 132. The one or more printed electronic elements 100 are printed prior to the final cure process 128 (see FIG. 1B) of the composite structure 12.

As shown in FIG. 7, the automated lamination method 200 further comprises the step 208 of using the modified automated lamination apparatus 60 to lay up one or more subsequent layers 58b (see FIGS. 1A-1B) of composite prepreg material 40 (see FIGS. 1A-1B) over the one or more printed electronic elements 100, to embed the one or more printed electronic elements 100 in the composite structure 12, to obtain embedded printed electronic elements 101 (see FIG. 1A).

As shown in FIG. 7, the automated lamination method 200 further comprises the step 210 of curing the composite structure 12 having the one or more printed electronic elements 100 embedded in the composite structure 12, wherein the one or more printed electronic elements 100 each maintain a mechanical stability 150 (see FIG. 1A) during and after curing, such as during and after the final cure process 128.

As shown in FIG. 7, the automated lamination method 200 may further comprise the optional step 212 of, after the step 208 of using the modified automated lamination apparatus 60 to lay up the one or more subsequent layers 58b, and prior to the step 210 of curing, the step 212 of repeating one or more times, all of each of, the step 204 of preparing with the section preparation pre-printing apparatus 92, the step 206 of printing with the non-contact direct write printing apparatus 110, and the step of 208 using the modified automated lamination apparatus 60 to lay up the one or more subsequent layers 58b.

The automated lamination method 200 may further comprise after the step 210 of curing the composite structure 12, the step of using the one or more printed electronic elements 100 embedded in the composite structure 12, to enable data collection 32 (see FIG. 1A) and structural health monitoring 34 (see FIG. 1A) in one or more interior portions 30 (see FIG. 1B) of the composite structure 12. The data collection 32 and structural health monitoring 34 may be performed, for example, during manufacture 36 (see FIG. 1B) of the composite structure 12, such as the aircraft composite part 16, and/or during an operational life 38 (see FIG. 1B) of the aircraft 18 (see FIG. 9), or other vehicle, that the composite structure 12, such as the aircraft composite part 16, is incorporated into.

Figure 8:
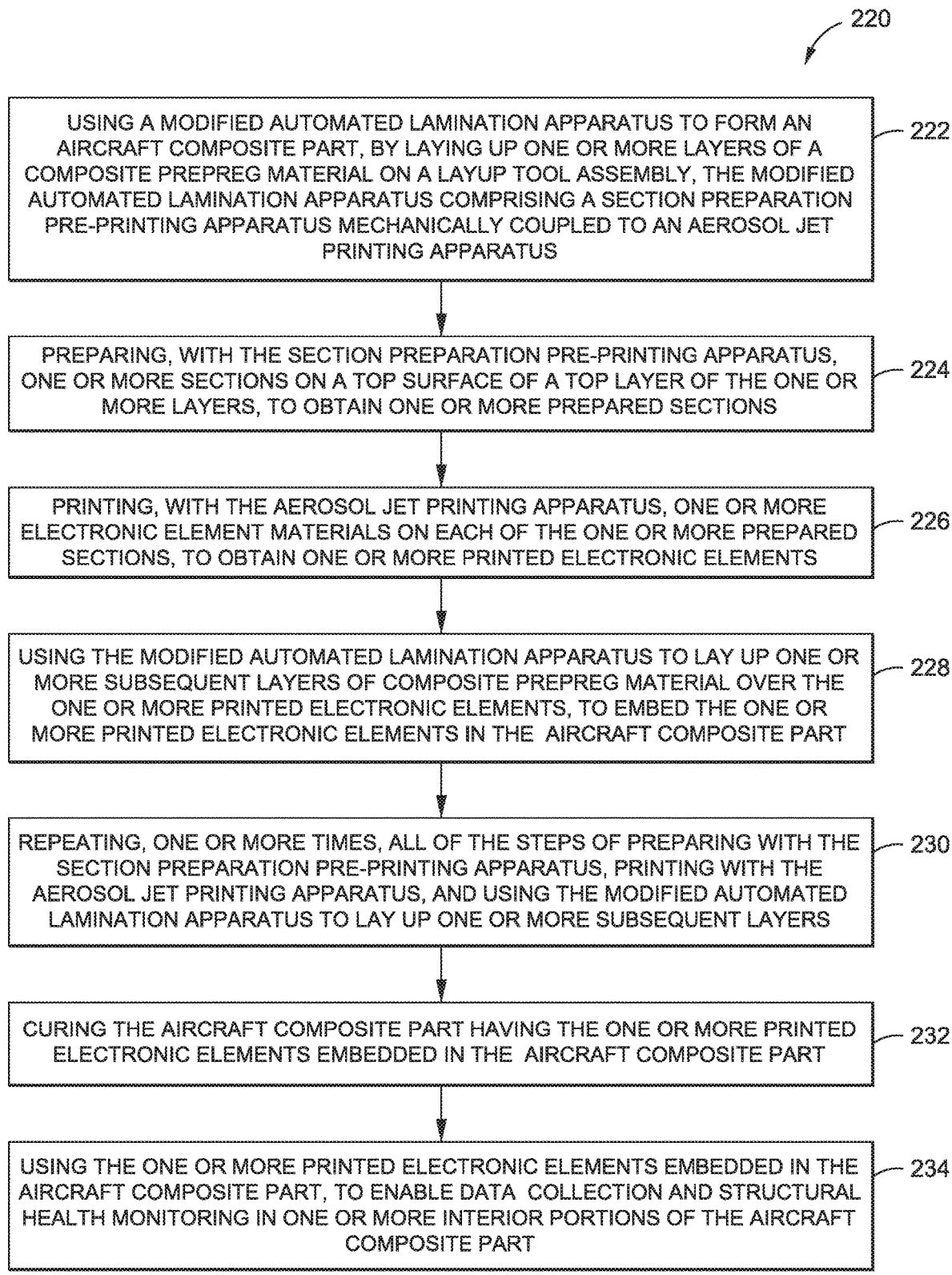
FIG. 8 is an illustration of a flow diagram of a version of another automated lamination method of the disclosure.

Now referring to FIG. 8, FIG. 8 is an illustration of a flow diagram of a version of another automated lamination method 220 of the disclosure. In another version of the disclosure, there is provided the automated lamination method 220 for embedding one or more printed electronic elements 100 (see FIGS. 1A-1B) in an aircraft composite part 16 (see FIGS. 1B, 9).

The blocks in FIG. 8 represent operations and/or portions thereof, or elements, and lines connecting the various blocks do not imply any particular order or dependency of the operations or portions thereof, or elements. FIG. 8 and the disclosure of the steps of the automated lamination method 220 set forth herein should not be interpreted as necessarily determining a sequence in which the steps are to be performed. Rather, although one illustrative order is indicated, it is to be understood that the sequence of the steps may be modified when appropriate. Accordingly, certain operations may be performed in a different order or simultaneously.

As shown in FIG. 8, the automated lamination method 220 comprises the step 222 of using a modified automated lamination apparatus 60 (see FIGS. 1A-1B) to form the aircraft composite part 16, by laying up one or more layers 58 (see FIGS. 1A-1B) of a composite prepreg material 40 (see FIGS. 1A-1B) on a layup tool assembly 54 (see FIGS. 1A-1B). The layup tool assembly comprises the layup tool 55 (see FIG. 1B), for example, a mold, a mandrel, or another suitable layup tool. The layup tool 55 has a surface 56 (see FIG. 1B) that may comprise a planar surface 56a (see FIG.

1B) or a contoured surface 56*b* (see FIG. 1B). The modified automated lamination apparatus 60 comprises a section preparation pre-printing apparatus 92 (see FIGS. 1A-1B) mechanically coupled to an aerosol jet printing apparatus 138 (see FIGS. 1A-1B). The step 222 of using the modified automated lamination apparatus 60 to form the aircraft composite part 16, may further comprise using the modified automated lamination apparatus 60 comprising one of, a modified automated tape laying apparatus 70 (see FIG. 1B), and a modified automated fiber placement apparatus 80 (see FIG. 1B).

As shown in FIG. 8, the automated lamination method 220 further comprises the step 224 of preparing, with the section preparation pre-printing apparatus 92 (see FIGS. 1A-1B), one or more sections 94 (see FIGS. 1A-1B) on a top surface 59 (see FIGS. 1A-1B) of a top layer 58*a* (see FIGS. 1A-1B) of the one or more layers 58, to obtain one or more prepared sections 96 (see FIGS. 1A-1B). The step 224 of preparing, with the section preparation pre-printing apparatus 92, the one or more sections 94, may further comprise preparing, with the section preparation pre-printing apparatus 92, the one or more sections 94 each having a size 102 (see FIG. 1B) preferably having a width 104 (see FIG. 1B) in a range of 10 microns (μ) to 20 microns (μ), and preferably having a length 106 (see FIG. 1B) in a range of 10 microns (μ) to 10 meters (m), such as in one example, a length 106 in a range of 10 microns (μ) to 20 microns (μ), and in another example, a length 106 in a range of 0.01 meter (10 centimeters) to 10 meters (1000 centimeters), and preferably having a thickness 108 (see FIG. 1B) in a range of 0.01 micron (μ) (10 nanometers (nm)) to 0.1 micron (μ) (100 nanometers (nm)). Where each of the one or more sections 94 has a length 106 in a range of 0.01 meter to 10 meters, this length 106 may be for a section 94 for a continuous conductive path to a location on the composite structure 12, such as the aircraft composite part 16, designated for interface with an external electronic system.

In one version, the step 224 of preparing, with the section preparation pre-printing apparatus 92, may further comprise preparing with the section preparation pre-printing apparatus 92 comprising an energy source apparatus 114 (see FIGS. 1A-1B) comprising a radiative heater 116 (see FIG. 1B), such as an infrared (IR) heater 118 (see FIG. 1B), a laser apparatus 120 (see FIG. 1B), such as a laser gun 120*a* (see FIG. 1B), or another suitable energy source apparatus, and performing a staged resin process 122 (see FIGS. 1A-1B) on each of the one or more sections 94 with the energy source apparatus 114, while the energy source apparatus 114 is coupled to the modified automated lamination apparatus 60 and the aircraft composite part 16 is being formed.

The staged resin process 122 comprises performing a localized partial cure operation 124 (see FIG. 1B) to a degree of cure 126 (see FIG. 1B) in a range of 5% to 30%, and in one example, in a range of 5% to 10%, to obtain the one or more prepared sections 96 comprising one or more localized partially cured sections 96*a* (see FIG. 1B). The resin 44 (see FIG. 1B) is preferably staged on the top surface 59 of the top layer 58*a*, or ply, and not all the way through the thickness of the top layer 58*a*, or ply, or through the layers 58 under the top layer 58*a*.

In another version, the step 224 of preparing, with the section preparation pre-printing apparatus 92, may further comprise preparing with the section preparation pre-printing apparatus 92 comprising a stamping apparatus 130 (see FIGS. 1A-1B) performing a substrate stamp process 132 (see FIGS. 1A-1B) on each of the one or more sections 94, while the stamping apparatus 130 is coupled to the modified automated lamination apparatus 60. The substrate stamp process 132 comprises stamping a substrate material 134 (see FIG. 1B), with the stamping apparatus 130, onto each of the one or more sections 94, to obtain the one or more prepared sections 96 comprising one or more stamped substrate sections 96*b* (see FIG. 1B). Each stamped substrate section 96*b* is configured to support, and supports, the one or more electronic element materials 98 and the printed electronic elements 100.

As shown in FIG. 8, the automated lamination method 220 further comprises the step 226 of printing, with the aerosol jet printing apparatus 138 (see FIGS. 1A-1B), one or more electronic element materials 98 (see FIGS. 1A-1B) on each of the one or more prepared sections 96, to obtain the one or more printed electronic elements 100 (see FIGS. 1A-1B). The step 226 of printing, with the aerosol jet printing apparatus 138, the one or more electronic element materials 98 on each of the one or more prepared sections 96, may further comprise printing, with the aerosol jet printing apparatus 138, the one or more electronic element materials 98 each having a particle size 146 (see FIG. 1B) in a range of 0.001 micron (μ) to 100 microns (μ), and/or each having a viscosity 148 (see FIG. 1B) in a range of 1 cP (centipoise) to 1000 cP.

The step 226 of printing, with the aerosol jet printing apparatus 138, the one or more electronic element materials 98 on each of the one or more prepared sections 96, may further comprise printing with the aerosol jet printing apparatus 138, the one or more electronic element materials 98 on each of the one or more prepared sections 96, to obtain the one or more printed electronic elements 100 comprising one or more of, as shown in FIG. 1B, sensors 100*a*, including strain sensors 100*b*, pressure sensors 100*c*, temperature sensors 100*d*, for example, variable resistance temperature sensors, or other suitable sensors, strain gauges 100*e*, traces 100*f*, for example, conductive traces, resistors 100*g*, conductors 100*h*, insulators 100*i*, inductors 100*j*, capacitors 100*k*, transistors 100*l*, solar cells 100*m*, micro-batteries 100*n*, circuit elements 100*o*, interconnect elements 100*p*, transducers 100*q*, antennas 100*r*, micro-antennas 100*s*, antenna elements 100*t*, antenna arrays 100*u*, RFID (radio-frequency identification) 100*v*, or other suitable printed electronic elements. The one or more printed electronic elements 100 may be printed on the prepared sections 96 obtained by the section 94 having undergone the staged resin process 122 or the substrate stamp process 132. The one or more printed electronic elements 100 are printed prior to the final cure process 128 (see FIG. 1B) of the aircraft composite part 16.

As shown in FIG. 8, the automated lamination method 220 further comprises the step 228 of using the modified automated lamination apparatus 60 to lay up one or more subsequent layers 58*b* (see FIGS. 1A-1B) of composite prepreg material 40 (see FIGS. 1A-1B) over the one or more printed electronic elements 100, to embed the one or more printed electronic elements 100 in the aircraft composite part 16, to obtain embedded printed electronic elements 101 (see FIG. 1A).

As shown in FIG. 8, the automated lamination method 220 further comprises the step 230 of repeating one or more times, all of each of, the step 224 of preparing with the section preparation pre-printing apparatus 92, the step 226 of printing with the aerosol jet printing apparatus 138, and the step 228 of using the modified automated lamination apparatus 60 to lay up the one or more subsequent layers 58*b*.

As shown in FIG. 8, the automated lamination method 220 further comprises the step 232 of curing the aircraft composite part 16 having the one or more printed electronic elements 100 embedded in the aircraft composite part 16, wherein the one or more printed electronic elements 100 each maintain a mechanical stability 150 (see FIG. 1A) during and after curing; such as during and after the final cure process 128 (see FIG. 1B).

As shown in FIG. 8, the automated lamination method 220 further comprises the step 234 of using the one or more printed electronic elements 100 embedded in the aircraft composite part 16, to enable data collection 32 (see FIG. 1A) and structural health monitoring 34 (see FIG. 1A), such as collect data and perform structural health monitoring 34, in one or more interior portions 30 (see FIG. 1B) of the aircraft composite part 16. The data collection 32 and structural health monitoring 34 may be performed, for example, during manufacture 36 (see FIG. 1B) of the aircraft composite part 16, and/or during an operational life 38 (see FIG. 1B) of the aircraft 18 (see FIG. 9) that the aircraft composite part 16 is incorporated into.

Figure 9:
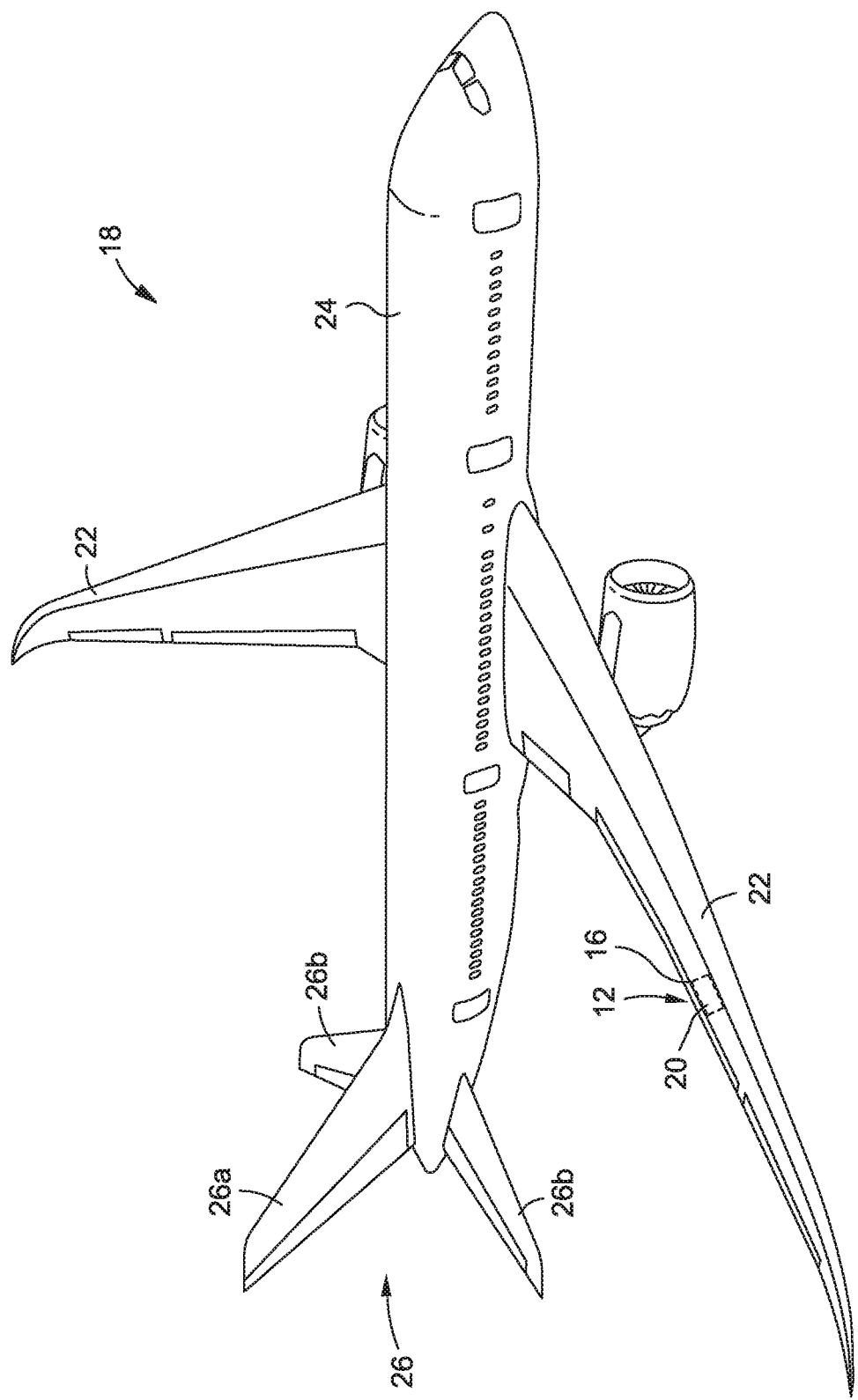
FIG. 9 is an illustration of a perspective view of an aircraft incorporating an aircraft composite part made with a version of an automated lamination system and an automated lamination method of the disclosure.

Now referring to FIG. 9, FIG. 9 is an illustration of a perspective view of an aircraft 18 incorporating a composite structure 12, such as an aircraft composite part 16, made with a version of an automated lamination system 10 (see FIGS. 1A-1B) and an automated lamination method 200 (see FIG. 7), or an automated lamination method 220 (see FIG. 8), of the disclosure. As shown in FIG. 9, the aircraft composite part 16 comprises a panel 20 on a wing 22 of the aircraft 18. The aircraft composite part 16 may also comprise other aircraft composite parts 16 on the wings 22, and may also comprise panels 20 (see FIG. 1B), or other aircraft composite parts 16, on the fuselage 24 (see FIG. 9) or on the tail 26 (see FIG. 9). As shown in FIG. 9, the tail 26 comprises a horizontal stabilizer portion 26a and vertical stabilizer portions 26b.

In an exemplary version, the composite structure 12 (see FIG. 9) comprises the aircraft composite part 16 (see FIG. 9) assembled on the aircraft 18 (see FIG. 9). In other versions of the composite structure 12 (see FIGS. 1A-1B), the composite structure 12 may comprise a rotorcraft composite structure on a rotorcraft, a spacecraft composite structure on a spacecraft, a satellite composite structure on a satellite, a watercraft composite structure on a watercraft, an automobile composite structure on an automobile, a truck composite structure on a truck, a windmill blade composite structure on a windmill, or another suitable composite structure.

Figure 10:
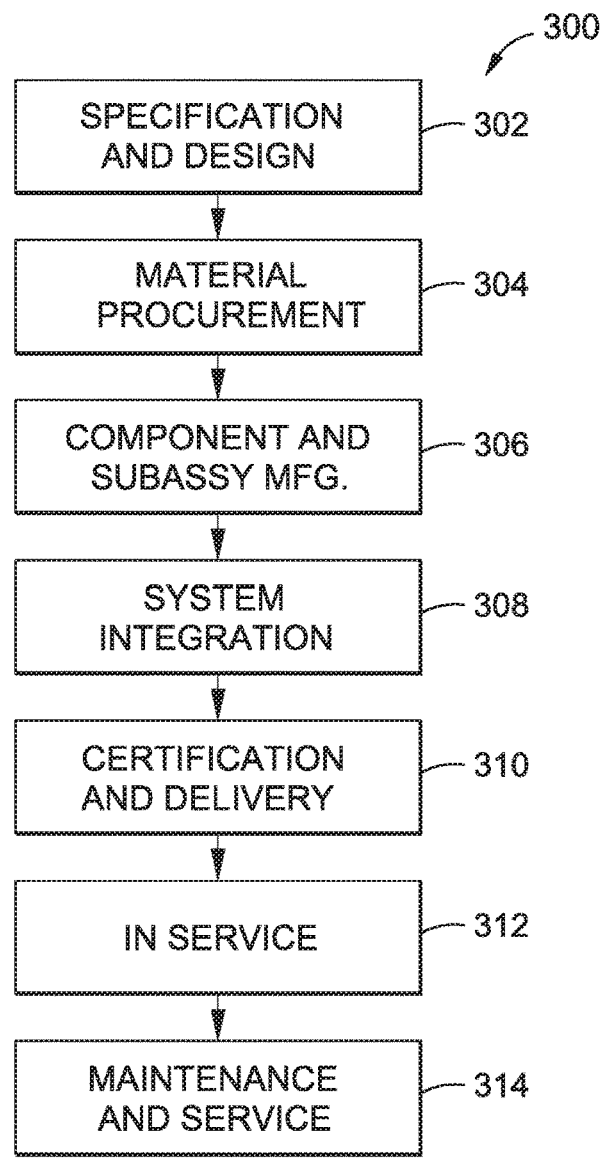
FIG. 10 is an illustration of a flow diagram of an exemplary aircraft manufacturing and service method.
Figure 11:
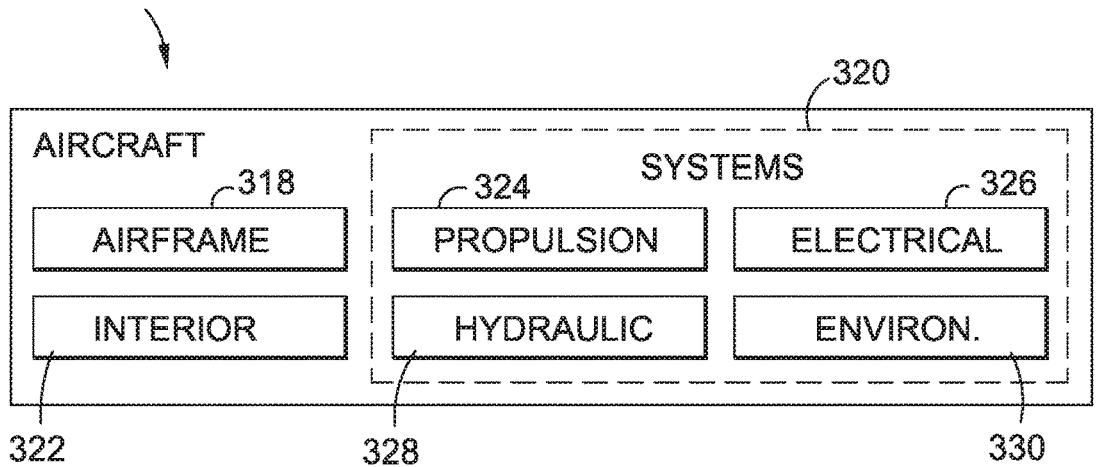
FIG. 11 is an illustration of an exemplary block diagram of an aircraft.

Now referring to FIGS. 10 and 11, FIG. 10 is an illustration of a flow diagram of an exemplary aircraft manufacturing and service method 300, and FIG. 11 is an illustration of an exemplary block diagram of an aircraft 316. Referring to FIGS. 10 and 11, versions of the disclosure may be described in the context of the aircraft manufacturing and service method 300 as shown in FIG. 10, and the aircraft 316 as shown in FIG. 11.

During pre-production, exemplary aircraft manufacturing and service method 300 may include specification and design 302 of the aircraft 316 and material procurement 304. During manufacturing, component and subassembly manufacturing 306 and system integration 308 of the aircraft 316 takes place. Thereafter, the aircraft 316 may go through certification and delivery 310 in order to be placed in service 312. While in service 312 by a customer, the aircraft 316 may be scheduled for routine maintenance and service 314 (which may also include modification, reconfiguration, refurbishment, and other suitable services).

Each of the processes of the aircraft manufacturing and service method 300 may be performed or carried out by a system integrator, a third party, and/or an operator (e.g., a customer). For the purposes of this description, a system integrator may include, without limitation, any number of aircraft manufacturers and major-system subcontractors. A third party may include, without limitation, any number of vendors, subcontractors, and suppliers. An operator may include an airline, leasing company, military entity, service organization, and other suitable operators.

As shown in FIG. 11, the aircraft 316 produced by the exemplary aircraft manufacturing and service method 300 may include an airframe 318 with a plurality of systems 320 and an interior 322. Examples of the plurality of systems 320 may include one or more of a propulsion system 324, an electrical system 326, a hydraulic system 328, and an environmental system 330. Any number of other systems may be included. Although an aerospace example is shown, the principles of the disclosure may be applied to other industries, such as the automotive industry.

Methods and systems embodied herein may be employed during any one or more of the stages of the aircraft manufacturing and service method 300. For example, components or subassemblies corresponding to component and subassembly manufacturing 306 may be fabricated or manufactured in a manner similar to components or subassemblies produced while the aircraft 316 is in service 312. Also, one or more apparatus embodiments, method embodiments, or a combination thereof, may be utilized during component and subassembly manufacturing 306 and system integration 308, for example, by substantially expediting assembly of or reducing the cost of the aircraft 316. Similarly, one or more of apparatus embodiments, method embodiments, or a combination thereof, may be utilized while the aircraft 316 is in service 312, for example and without limitation, to maintenance and service 314.

Disclosed embodiments of the automated lamination system 10 (see FIGS. 1A-1B), the automated lamination method 200 (see FIG. 7), and the automated lamination method 220 (see FIG. 8) provide for automatically embedding one or more printed electronic elements 100, such as sensors 100a, and other printed electronic elements, in a composite structure 12 (see FIGS. 1A-1B), such as an aircraft composite part 16 (see FIGS. 1B, 9), by using a modified automated lamination apparatus 60 (see FIGS. 1A-1B), such as a modified automated tape laying apparatus 70 (see FIG. 1B) or a modified automated fiber placement apparatus 80 (see FIG. 1B). The one or more printed electronic elements 100 are automatically printed between layers 58 (see FIGS. 1A-1B), or plies, of composite prepreg material 40 (see FIGS. 1A-1B), prior to cure, such as the final cure process 128 (see FIG. 1B), rather than being printed on the surface of the cured composite structure or part, after final cure. The one or more embedded printed electronic elements 101 (see FIG. 1A) allow for monitoring and taking measurements of the strain, pressure, and temperature throughout the volume of the composite structure 12 (see FIGS. 1A-1B), such as the aircraft composite part 16, during manufacture 36 (see FIG. 1B) and operations.

The modified automated lamination apparatus 60, as discussed above, may comprise a composite tape laying machine (CTLM) 66 (see FIG. 1B), such as a computer numerically controlled (CNC) CTLM 68 (see FIG. 1B), modified by adding a section preparation pre-printing apparatus 92 (see FIGS. 1A-1B) mechanically coupled to a non-contact direct write printing apparatus 110 (see FIGS. 1A-1B) together on a second head 112 (see FIG. 1B), where the second head 112 is either coupled, or attached, to the first head 74, such as the placement head 74a, or is separate from the first head 74. In one version, as discussed above, the section preparation pre-printing apparatus 92 may comprise an energy source apparatus 114 (see FIG. 1B), such as an infrared (IR) heater 118 (see FIG. 1B) or a laser apparatus 120 (see FIG. 1B), to perform a staged resin process 122 (see FIGS. 1A-1B). The staged resin process 122 comprises automatically performing on each of one or more sections 94 (see FIGS. 1A-1B), or portions, on a layer 58 of composite prepreg material 40, a localized partial cure operation 124 (see FIG. 1B) to a degree of cure 126 (see FIG. 1B) in a range of 5% to 30%, and in one example, in a range of 5% to 10%, to obtain one or more prepared sections 96 (see FIGS. 1A-1B) comprising one or more localized partially cured sections 96a (see FIG. 1B). The localized partial cure operation 124 is performed while still on the modified automated lamination apparatus 60. This allows for printing one or more electronic element materials 98 directly onto a partially cured section 94 of the composite prepreg material 40.

In another version, as discussed above, the section preparation pre-printing apparatus 92 may comprise a stamping apparatus 130 (see FIGS. 1A-1B) to automatically perform a substrate stamp process 132 (see FIGS. 1A-1B) on each of the one or more sections 94, or portions. The substrate stamp process 132 comprises stamping a substrate material 134 (see FIG. 1B), with the stamping apparatus 130, onto each of the one or more sections 94, or portions, of the composite prepreg material 40 that is uncured, to obtain the one or more prepared sections 96 comprising one or more stamped substrate sections 96b (see FIG. 1B). The non-contact direct write printing apparatus 110 preferably comprises an aerosol jet printing apparatus 138 (see FIGS. 1B, 3), to enable automatic printing of the one or more electronic element materials 98 (see FIGS. 1A-1B), on the prepared sections 96 on the one or more layers 58, such as the top layer 58a, of the composite prepreg material 40, and after the sections 94 have undergone either the staged resin process 122 or the substrate stamp process 132, to form the prepared sections 96.

In addition, disclosed embodiments of the automated lamination system 10 (see FIGS. 1A-1B), the automated lamination method 200 (see FIG. 7), and the automated lamination method 220 (see FIG. 8) provide numerous advantages, including that the one or more printed electronic elements 100 enable data collection 32 (see FIG. 1A) and structural health monitoring 34 (see FIG. 1A) throughout the interior 28, and throughout the thickness, of the composite structure 12, such as the aircraft composite part 16, for example, during manufacture 36 (see FIG. 1B) of the composite structure 12, such as the aircraft composite part 16, and/or during an operational life 38 (see FIG. 1B) of the aircraft 18 (see FIG. 9), or other vehicle, that the composite structure 12, such as the aircraft composite part 16, is incorporated into. Collecting operational data and performing structural health monitoring 34 for aircraft 18, and other vehicles, enable monitoring of the internal health of the composite structure 12, such as the aircraft composite part 16, to monitor the presence of possible delamination or cracks, and to enable monitoring throughout the composite structure 12, such as the aircraft composite part 16, to detect any possible areas having issues. Data collection 32 and structural health monitoring 34 may enable the delay of heavy maintenance based on actual collected data specific to an aircraft 18, or other vehicles, and may detect changes in stiffness that may indicate a possible crack in a panel 20, such as skin, or in an aircraft stringer, thereby indicating needed maintenance. Such data collection 32 and structural health monitoring 34 may enable a continuous data monitoring program for aircraft 18, and other vehicles. The structural health monitoring 34 throughout the operational life 38 of the aircraft 18 (see FIG. 9), or other vehicle, is enabled at a minimal incremental cost in production and design. In addition, collecting operational data and performing structural health monitoring 34 for aircraft 18, and other vehicles, enable design improvements for future aircraft and vehicles.

Further, disclosed embodiments of the automated lamination system 10 (see FIGS. 1A-1B), the automated lamination method 200 (see FIG. 7), and the automated lamination method 220 (see FIG. 8) enable the printing of numerous printed electronic elements 100, including sensors 100a (see FIG. 1B), strain sensors 100b (see FIG. 1B), pressure sensors 100c (see FIG. 1B), temperature sensors 100d (see FIG. 1B), and other printed electronic elements in the interior 28 (see FIG. 1B) of the composite structure 12, such as the aircraft composite part 16, and between layers 58, or plies, of composite prepreg material 40 (see FIGS. 1A-1B), prior to the final cure process 128 (see FIG. 1B). In addition, the printed electronic elements 100 comprise resistors 100g (see FIG. 1B) that include resistors whose resistance changes with temperature, to provide a way of measuring temperature. For example, by plugging a copper wire attached to one or more embedded printed electronic elements 101 into a wall, temperature may be monitored or measured not only on the trim of the composite structure 12, but all through its volume. Thus, it may be possible to measure the temperature of the composite structure 12 during cure, such as the final cure process 128, at numerous locations within the composite structure 12, and at a low cost.

Moreover, disclosed embodiments of the automated lamination system 10 (see FIGS. 1A-1B), the automated lamination method 200 (see FIG. 7), and the automated lamination method 220 (see FIG. 8) provide for embedding printed electronic elements 100 (see FIG. 1A) to enable temperature monitoring and measurement through the cure of the composite structure 12, such as the aircraft composite part 16, without the need for thermocouples. There is no need to manually place individual thermocouples within the trim of the composite structure, to unroll long individual wires, and to then plug the thermocouples each individually into the plugs in an autoclave wall. By not having to manually place individual thermocouples in a composite structure, the time and cost of manual thermocouple installation is avoided and the uncertainty as to accurate thermocouple placement is avoided. In addition, by using the non-contact direct write printing apparatus 110, such as the aerosol jet printing apparatus 138, in the automated lamination system 10, to print the one or more printed electronic elements 100, no adhesion between the one or more printed electronic elements 100 and the layers 58 of composite prepreg material 40 or composite laminate 14 is needed and the placement of the one or more printed electronic elements 100 is controlled by the computer 76 of the control system 78, such as in the CNC CTLM 68. Thus, the placement process of the one or more printed electronic elements 100 is streamlined and the placement accuracy improved. Disclosed embodiments of the automated lamination system 10 (see FIGS. 1A-1B), the automated lamination method 200 (see FIG. 7), and the automated lamination method 220 (see FIG. 8) provide for automated placement of the one or more printed electronic elements 100, rather than manual placement, into the composite structure 12, and thus avoid any misalignment or adhesion process issues associated with known manual placement systems and processes.

In addition, the printing of the printed electronic elements 100 and embedding of the printed electronic elements 100 in the interior 28 (see FIG. 1B) of the composite structure 12, results in no mechanical instability or issues from resin flow during the final cure process 128, and results in no degradation of mechanical properties of the composite structure 12 during and after the final cure process 128. Although it is preferable to print and embed the one or more printed electronic elements 100 inside the composite structure 12, it is also possible to print the one or more printed electronic elements on the top surface of the composite structure 12, prior to the final cure process 128, without any mechanical instability. Further, disclosed embodiments of the automated lamination system 10 (see FIGS. 1A-1B), the automated lamination method 200 (see FIG. 7), and the automated lamination method 220 (see FIG. 8) are repeatable, quicker, and more accurate than known systems and methods of manual installation of sensors, thermocouples, and other electronic elements.

Many modifications and other versions of the disclosure will come to mind to one skilled in the art to which this disclosure pertains having the benefit of the teachings presented in the foregoing descriptions and the associated drawings. The versions described herein are meant to be illustrative and are not intended to be limiting or exhaustive. Although specific terms are employed herein, they are used in a generic and descriptive sense only and not for purposes of limitation.

What is claimed is:

1. An automated lamination system for embedding one or more printed electronic elements in a composite structure, the automated lamination system comprising:
    a supply of composite prepreg material;
    a layup tool assembly;
    a modified automated lamination apparatus laying up one or more layers of the composite prepreg material on the layup tool assembly, to form the composite structure, the modified automated lamination apparatus comprising:
        a composite tape laying machine (CTLM) having a first head with one or more spools, one or more compaction rollers, and a heater for heating and curing, with a final cure process, the composite structure, after it is formed on the layup tool assembly; and
        a second head added to the CTLM, the second head comprising:
            a section preparation pre-printing apparatus positioned on the second head to prepare one or more sections, each having a width in a range of 10 microns to 20 microns, on a top surface of a top layer of the one or more layers, to obtain one or more prepared sections, the section preparation pre-printing apparatus comprising one of,
                an energy source apparatus separate from the heater on the CTLM, and comprising one of, a targeted infrared heater, or a laser apparatus, the energy source apparatus performing a localized partial cure operation on each of the one or more sections, to obtain the one or more prepared sections comprising one or more localized partially cured sections having a degree of cure in a range of 5% to 30%; or
                a stamping apparatus stamping a substrate material in the form of a substrate platform onto each of the one or more sections that are uncured, to obtain the one or more prepared sections comprising one or more stamped substrate sections, the substrate platform having a width in a range of 15 microns to 25 microns; and
            an aerosol jet printing apparatus mechanically coupled to the section preparation pre-printing apparatus and positioned on the second head downstream of the section preparation pre-printing apparatus, and positioned upstream of one of the compaction rollers, the aerosol jet printing apparatus having one or more printing heads; and
        one or more supplies of electronic element materials, printed with the aerosol jet printing apparatus, on each of the one or more prepared sections, to obtain the one or more printed electronic elements,
        wherein the modified automated lamination apparatus lays up one or more subsequent layers of the composite prepreg material over the one or more printed electronic elements, to embed the one or more printed electronic elements in the composite structure, prior to the composite structure being cured with the final cure process, and further wherein, when the composite structure is cured, the one or more printed electronic elements each maintain a mechanical stability;
    a control system coupled to the modified automated lamination apparatus, the control system controlling one or more operations of the modified automated lamination apparatus; and
    a power system coupled to the modified automated lamination apparatus, the power system providing a power source to the modified automated lamination apparatus.

2. The automated lamination system of claim 1, wherein the modified automated lamination apparatus comprises one of, a modified automated tape laying apparatus, and a modified automated fiber placement apparatus.

3. The automated lamination system of claim 1, wherein the modified automated lamination apparatus further comprises a gantry, to suspend the modified automated lamination apparatus above the layup tool assembly.

4. The automated lamination system of claim 1, wherein the second head is mechanically attached to the first head.

5. The automated lamination system of claim 1, wherein the substrate material comprises indium, indium alloys, gallium, or gallium alloys.

6. The automated lamination system of claim 1, wherein the substrate material is stamped onto the composite prepreg material that is uncured at a location between the compaction roller on the first head and an end of the second head.

7. The automated lamination system of claim 1, wherein each of the one or more sections has a length in a range of 10 microns to 10 meters, and a thickness in a range of 0.01 micron to 0.1 micron.

8. The automated lamination system of claim 1, wherein each of the one or more printed electronic elements has a width in a range of 10 microns to 20 microns.

9. The automated lamination system of claim 1, wherein the one or more printed electronic elements comprise one or more of, sensors, strain sensors, pressure sensors, temperature sensors, strain gauges, traces, resistors, conductors, insulators, inductors, capacitors, transistors, solar cells, micro-batteries, circuit elements, interconnect elements, transducers, antennas, micro-antennas, antenna elements, antenna arrays, and RFID (radio-frequency identification).

10. An automated lamination method for embedding one or more printed electronic elements in a composite structure, the automated lamination method comprising the steps of:

using a modified automated lamination apparatus to form the composite structure, by laying up one or more layers of a composite prepreg material on a layup tool assembly, the modified automated lamination apparatus comprising:
- a composite tape laying machine (CTLM) having a first head with one or more spools, one or more compaction rollers, and a heater for heating and curing, with a final cure process, the composite structure, after it is formed on the layup tool assembly; and
- a second head added to the CTLM, the second head comprising:
  - a section preparation pre-printing apparatus positioned on the second head and comprising one of,
    - an energy source apparatus separate from the heater on the CTLM, and comprising one of, a targeted infrared heater, or a laser apparatus; or
    - a stamping apparatus stamping a substrate material in the form of a substrate platform onto each of the one or more sections that are uncured, the substrate platform having a width in a range of 15 microns to 25 microns; and
  - an aerosol jet printing apparatus mechanically coupled to the section preparation pre-printing apparatus and positioned on the second head downstream of the section preparation pre-printing apparatus, and positioned upstream of one of the compaction rollers, the aerosol jet printing apparatus having one or more printing heads;

preparing, with the section preparation pre-printing apparatus, one or more sections, each having a width in a range of 10 microns to 20 microns, on a top surface of a top layer of the one or more layers, to obtain one or more prepared sections, the energy source apparatus partially curing each of the one or more sections, to obtain the one or more prepared sections comprising one or more localized partially cured sections having a degree of cure in a range of 5% to 30%, and the stamping apparatus stamping the substrate material onto each of the one or more sections, to obtain the one or more prepared sections comprising one or more stamped substrate sections;

printing, with the aerosol jet printing apparatus, one or more electronic element materials on each of the one or more prepared sections, to obtain the one or more printed electronic elements;

using the modified automated lamination apparatus to lay up one or more subsequent layers of composite prepreg material over the one or more printed electronic elements, to embed the one or more printed electronic elements in the composite structure; and curing the composite structure having the one or more printed electronic elements embedded in the composite structure, wherein the one or more printed electronic elements each maintain a mechanical stability during and after curing.

11. The automated lamination method of claim 10, further comprising after using the modified automated lamination apparatus to lay up the one or more subsequent layers, and prior to curing, repeating one or more times, all of the steps of preparing with the section preparation pre-printing apparatus, printing with the aerosol jet printing apparatus, and using the modified automated lamination apparatus to lay up the one or more subsequent layers.

12. The automated lamination method of claim 10, further comprising after curing the composite structure, using the one or more printed electronic elements embedded in the composite structure, to enable data collection and structural health monitoring in one or more interior portions of the composite structure.

13. The automated lamination method of claim 10, wherein using the modified automated lamination apparatus to form the composite structure, further comprises using the modified automated lamination apparatus comprising one of, a modified automated tape laying apparatus, and a modified automated fiber placement apparatus.

14. The automated lamination method of claim 10, wherein preparing, with the section preparation pre-printing apparatus, further comprises performing a staged resin process on each of the one or more sections with the energy source apparatus, while the energy source apparatus is coupled to the modified automated lamination apparatus.

15. The automated lamination method of claim 10, wherein using the modified automated lamination apparatus to form the composite structure, further comprises using the modified automated lamination apparatus, wherein the second head is mechanically attached to the first head.

16. The automated lamination method of claim 10, wherein preparing, with the section preparation pre-printing apparatus, further comprises performing a substrate stamp process on each of the one or more sections, while the stamping apparatus is coupled to the modified automated lamination apparatus.

17. The automated lamination method of claim 10, wherein preparing, with the section preparation pre-printing apparatus, further comprises stamping the substrate material onto the composite prepreg material that is uncured at a location between the compaction roller on the first head and an end of the second head.

18. An automated lamination method for embedding one or more printed electronic elements in an aircraft composite part, the automated lamination method comprising the steps of:

using a modified automated lamination apparatus to form the aircraft composite part, by laying up one or more layers of a composite prepreg material on a layup tool assembly, the modified automated lamination apparatus comprising:
- a composite tape laying machine (CTLM) having a first head with one or more spools, one or more compaction rollers, and a heater for heating and curing, with a final cure process, the composite structure, after it is formed on the layup tool assembly; and
- a second head added to the CTLM, the second head comprising:
  - a section preparation pre-printing apparatus positioned on the second head and comprising one of,
    - an energy source apparatus separate from the heater on the CTLM, and comprising one of, a target infrared heater, or a laser apparatus; or
    - a stamping apparatus stamping a substrate material in the form of a substrate platform onto each of the one or more sections that are uncured, the substrate platform having a width in a range of 15 microns to 25 microns; and
  - an aerosol jet printing apparatus mechanically coupled to the section preparation pre-printing apparatus and positioned on the second head downstream of the section preparation pre-printing apparatus, and positioned upstream of one of the compaction rollers, the aerosol jet printing apparatus having one or more printing heads;

preparing, with the section preparation pre-printing apparatus, one or more sections, each having a width in a range of 10 microns to 20 microns, on a top surface of a top layer of the one or more layers, to obtain one or more prepared sections, the energy source apparatus partially curing each of the one or more sections, to obtain the one or more prepared sections comprising one or more localized partially cured sections having a degree of cure in a range of 5% to 30%, and the stamping apparatus stamping the substrate material onto each of the one or more sections, to obtain the one or more prepared sections comprising one or more stamped substrate sections;

printing, with the aerosol jet printing apparatus, one or more electronic element materials on each of the one or more prepared sections comprising one of, the localized partially cured sections, or the stamped substrate sections, to obtain one or more printed electronic;

using the modified automated lamination apparatus to lay up one or more subsequent layers of composite prepreg material over the one or more printed electronic elements, to embed the one or more printed electronic elements in the aircraft composite part;

repeating one or more times, all of the steps of preparing with the section preparation pre-printing apparatus, printing with the aerosol jet printing apparatus, and using the modified automated lamination apparatus to lay up the one or more subsequent layers;

curing the aircraft composite part having the one or more printed electronic elements embedded in the aircraft composite part, wherein the one or more printed electronic elements each maintain a mechanical stability during and after curing; and using the one or more printed electronic elements embedded in the aircraft composite part, to enable data collection and structural health monitoring in one or more interior portions of the aircraft composite part.

19. The automated lamination method of claim 18, wherein preparing, with the section preparation pre-printing apparatus, further comprises performing a staged resin process on each of the one or more sections with the targeted infrared heater or the laser apparatus, while the targeted infrared heater or the laser apparatus is coupled to the modified automated lamination apparatus.

20. The automated lamination method of claim 18, wherein preparing, with the section preparation pre-printing apparatus, further comprises performing a substrate stamp process on each of the one or more sections, while the stamping apparatus is coupled to the modified automated lamination apparatus.

* * * * *